United States Patent
Joshi et al.

(10) Patent No.: US 10,861,816 B2
(45) Date of Patent: Dec. 8, 2020

(54) ELECTRONIC ASSEMBLIES HAVING A MESH BOND MATERIAL AND METHODS OF FORMING THEREOF

(71) Applicant: Toyota Motor Engineering & Manufacturing North America, Inc., Plano, TX (US)

(72) Inventors: Shailesh N Joshi, Ann Arbor, MI (US); Naoya Take, Canton, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 18 days.

(21) Appl. No.: 16/164,286

(22) Filed: Oct. 18, 2018

(65) Prior Publication Data

US 2020/0126943 A1    Apr. 23, 2020

(51) Int. Cl.
    *H01L 23/00* (2006.01)

(52) U.S. Cl.
    CPC ............. *H01L 24/29* (2013.01); *H01L 24/27* (2013.01); *H01L 24/32* (2013.01); *H01L 24/33* (2013.01);
    (Continued)

(58) Field of Classification Search
    CPC ......... H01L 24/29; H01L 24/27; H01L 24/83; H01L 24/32; H01L 24/33; H01L 2224/83815; H01L 2224/29111; H01L 2224/32225; H01L 2224/73215; H01L 2224/73265; H01L 2224/29144; H01L 2224/29147; H01L 2224/29155; H01L 2224/29015; H01L 24/73; H01L 2224/2711; H01L 24/48; H01L 2224/33181; H01L 2224/27462; H01L 2224/48091; H01L 2224/48175;
    (Continued)

(56) References Cited

U.S. PATENT DOCUMENTS

6,042,922 A * 3/2000 Senoo ............... H01L 24/83
                                                    428/66.6
6,436,733 B2    8/2002 Yukawa
(Continued)

FOREIGN PATENT DOCUMENTS

EP    3018711 A1    11/2016
EP    3217424 A1     9/2017
(Continued)

*Primary Examiner* — Steven H Loke
*Assistant Examiner* — Juanita B Rhodes
(74) *Attorney, Agent, or Firm* — Dinsmore & Shohl LLP

(57) ABSTRACT

Embodiments of the present disclosure include a method of forming an electronic assembly with a mesh bond layer. The method may include forming a mesh bond material comprising a first surface spaced apart from a second surface by a thickness of the mesh bond material and one or more openings extending from the first surface through the thickness of the mesh bond material to the second surface. The method may further include adjusting at least one of: the thickness of the mesh bond material, a geometry of the one or more openings, or a size of the one or more openings of the mesh bond material, where the adjusting modifies a Young's modulus of the mesh bond material, and bonding the first surface of the mesh bond material to a surface of a semiconductor device.

18 Claims, 15 Drawing Sheets

(52) U.S. Cl.
CPC .............. *H01L 24/83* (2013.01); *H01L 24/48* (2013.01); *H01L 24/73* (2013.01); *H01L 2224/2711* (2013.01); *H01L 2224/27462* (2013.01); *H01L 2224/29015* (2013.01); *H01L 2224/29111* (2013.01); *H01L 2224/29144* (2013.01); *H01L 2224/29147* (2013.01); *H01L 2224/29155* (2013.01); *H01L 2224/32225* (2013.01); *H01L 2224/33181* (2013.01); *H01L 2224/48091* (2013.01); *H01L 2224/48175* (2013.01); *H01L 2224/73215* (2013.01); *H01L 2224/73265* (2013.01); *H01L 2224/83815* (2013.01)

(58) Field of Classification Search
CPC ........... H01L 23/49562; H01L 23/4334; H01L 2224/29083; H01L 2224/2908; H01L 2224/2912; H01L 2224/29116; H01L 2224/83424; H01L 2224/83447; H01L 2224/83455; H01L 2224/32145; H01L 2224/0346; H01L 2224/05655; H01L 2224/04026; H01L 2224/29011; H01L 2224/29014; H01L 2224/29018; H01L 2224/8381; H01L 2224/83205; H01L 2224/83207; H01L 2224/83224; H01L 2224/32245; H01L 2924/3512

See application file for complete search history.

(56) References Cited

U.S. PATENT DOCUMENTS

| | | | |
|---|---|---|---|
| 7,679,091 | B2 | 3/2010 | Kusumoto et al. |
| 8,643,185 | B2 | 2/2014 | Kajiwara et al. |
| 2006/0091567 | A1 | 5/2006 | Lin et al. |
| 2007/0089811 | A1* | 4/2007 | Ikeda ...................... H01L 24/83 148/536 |
| 2013/0177440 | A1 | 7/2013 | Zhang et al. |
| 2017/0080682 | A1* | 3/2017 | Joshi ......................... B32B 7/04 |

FOREIGN PATENT DOCUMENTS

| | | | | |
|---|---|---|---|---|
| JP | 2005045086 | A | | 2/2005 |
| JP | 2013168545 | A | | 8/2013 |
| JP | 2015135956 | A | * | 7/2015 ............. H01L 24/29 |
| JP | 2015135956 | A | | 7/2015 |

* cited by examiner

ELECTRONIC ASSEMBLIES HAVING A MESH BOND MATERIAL AND METHODS OF FORMING THEREOF

TECHNICAL FIELD

The present specification generally relates to mesh bond materials and methods of forming and adjusting mesh bond materials and, more specifically, to methods of modifying the porosity, thickness, and/or geometry of the openings within the mesh bond material to increase or decrease the Young's modulus of the mesh bond material.

BACKGROUND

In general, a semiconductor device is bonded to a substrate or another semiconductor device through a bond material, thereby forming an electronic assembly. From the time a semiconductor device is bonded to a bonding surface of another material, each of the components of the electronic assembly undergoes a variety of stresses and strains. For example, these stresses and strains may arise from mechanical vibrations and impacts, variations in electrical loading, and/or variations in temperature subjected to the electronic assembly. Each of these and other factors can contribute to the extension and compression of the semiconductor device, the bond material, and any other substrate or device included in the electronic assembly. The extension and compression of a material is generally referred to as elastic deformation. In most instances, elastic deformation is reversible. However, even if elastic deformation is reversible, degradation to the bond layer and/or the semiconductor device and the other materials bonded thereto can occur.

SUMMARY

In one embodiment, a method of forming an electronic assembly with a mesh bond layer may include forming a mesh bond material comprising a first surface spaced apart from a second surface by a thickness of the mesh bond material and one or more openings extending from the first surface through the thickness of the mesh bond material to the second surface. The method may further include adjusting at least one of: the thickness of the mesh bond material, a geometry of the one or more openings, or a size of the one or more openings of the mesh bond material, where the adjusting modifies a Young's modulus of the mesh bond material and bonding the first surface of the mesh bond material to a surface of a semiconductor device.

In some embodiments, a method of forming an electronic assembly having a mesh bond layer may include forming a composite mesh bond material comprising a first metal adjacent a second metal, the composite mesh bond material comprising a first surface spaced apart from a second surface by a thickness of the composite mesh bond material and one or more openings extending from the first surface through the thickness of the composite mesh bond material to the second surface. The method may further include modifying the composite mesh bond material such that the composite mesh bond material exhibiting a first composite Young's modulus is adjusted to a second composite Young's modulus, where the first composite Young's modulus is different than the second composite Young's modulus and modifying the composite mesh bond material includes adjusting at least one of: the thickness of the composite mesh bond material, a geometry of the one or more openings, or a size of the one or more openings of the composite mesh bond material, and bonding the first surface of the composite mesh bond material to a surface of a semiconductor device.

In some embodiments, an electronic assembly may include a semiconductor device and a mesh bond layer bonded to the semiconductor device. The mesh bond layer includes a mesh bond material having a first surface spaced apart by a thickness of material from a second surface opposite the first surface, one or more openings extending from the first surface through the thickness of the mesh bond material to the second surface, and a Young's modulus defined by at least one of the thickness of material, a geometry of the one or more openings, and a size of the one or more openings such that the mesh bond layer operates in an elastic region when subjected to a predefined range of temperatures.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1A:
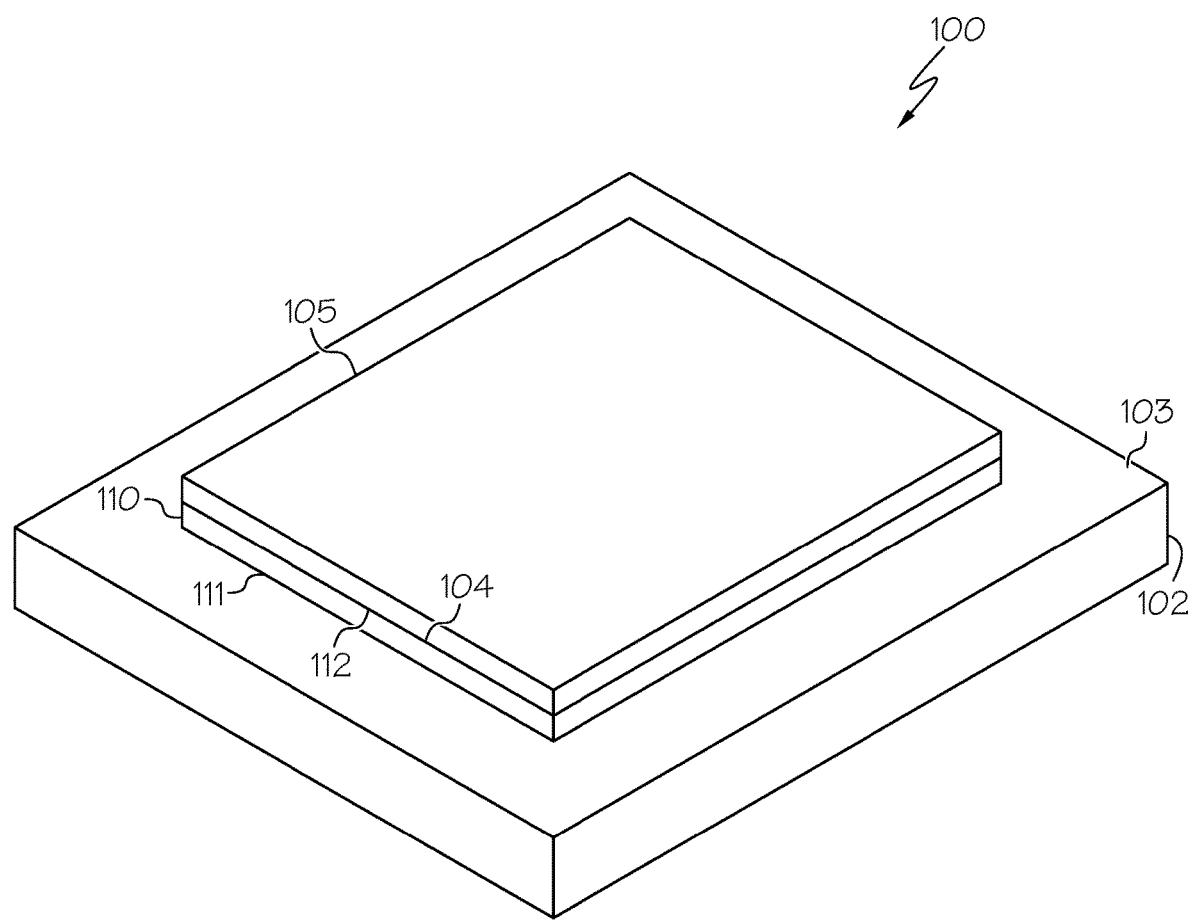
FIG. 1A schematically depicts a perspective view of an illustrative electronics assembly having a mesh bond material, according to one or more embodiments shown and described herein.

Embodiments described herein relate to bond materials, methods for forming bond materials, and use of bond materials in electronic assemblies to reduce stress concentrations in the bond layer, which may reside between a semiconductor device and a substrate. In general, a semiconductor device is bonded to a substrate or another semiconductor device through a bond material.

There are multiple processes for bonding a semiconductor device to another semiconductor device, a wire, a substrate, or the like. One example is soldering, which includes applying a melted filler metal (e.g., solder, which is customarily made of different alloys depending on the application, but commonly an alloy of tin) between the mating surfaces of the semiconductor device and material intended to be bonded to the semiconductor device. The solder, which forms a mechanical, electrical, and thermal joint between the semiconductor device and the bonding surface of another material, is intended to maintain each of the aforementioned properties (i.e., the mechanical, electrical and thermal interface) thereby providing a reliable bond between the semiconductor device and the bonding surface of another material.

As another non-limiting example, a semiconductor device may be bonded to another substrate by transient liquid phase (TLP) bonding. TLP bonding includes providing a low melting temperature material (e.g., tin or indium) adjacent to a high melting temperature material (e.g., copper, nickel, or aluminum) wherein the low melting temperature material has a lower melting temperature than the high melting temperature material. The low melting temperature material and the high melting temperature material may be provided by thin films and/or by individual particles or core/shell particles including the low and high melting temperature materials. The semiconductor device and the substrate may have a coating or layer of a high melting temperature material. During TLP bonding, the semiconductor device, the low and high melting temperature materials and the substrate are subjected to a sintering temperature greater than the melting temperature of the low melting temperature material (e.g., between about 280° C. and about 350° C.) for a period of time. The sintering temperature causes the low melting temperature material to melt and diffuse into the high melting temperature material, thereby forming one or more intermetallic compound layers that bond the semiconductor device to the substrate. The one or more intermetallic compound layers (i.e., TLP bond layers) have a melting temperature that is greater than the sintering temperature.

In some instances, stress concentrations in the bond layer can arise from thermal expansion and contraction of materials in the bond layer and the materials and devices bonded thereto. That is, as the temperature of a material increases, for example, as a result of heat generated by a semiconductor device, the material making up the electronic assembly may expand disproportionately and/or non-uniformly due to coefficient of thermal expansion (CTE) mismatch between the various layers and components, causing localized stress concentrations. Over time, thermal expansion and contraction of the materials in the bond layer may result in deformation and degradation. When bond layers degrade and/or deform their mechanical, electrical, and thermal properties may become inhibited causing mechanical, electrical, and/or thermal issues for an electronic assembly. TLP bond layers may be particularly susceptible to thermally induced stress because, although they have a high melting temperature, they are brittle and may crack easily. However, as described herein, by configuring a bond layer, for example, that is constructed with a mesh bond material configured to exhibit a particular Young's modulus a bond layer may overcome degradation and/or deformation as compared to a material that does not exhibit a Young's modulus tuned for the particular electronic assembly and application. By adjusting the Young's modulus of a bond material, the degradation and/or deformation of the bond layer may be reduced or avoided.

The Young's modulus of a material is a mechanical property that defines the stiffness of the material. It defines the relationship between stress (force per unit area) and strain (proportional deformation) in a material. Such a relationship quantifies the resistance of a material to elastically deform under load. As a result, Young's modulus enables the calculation of the change in the dimension of a material made of an elastic material under tensile or compressive loads. For instance, the Young's modulus may be used as a predictor of how much a material sample extends under tension or shortens under compression. With the increase of temperature, the material will have a volume expansion. Thus, the effect of the Young's modulus of a material and the temperature subjected to a material involves two aspects; one is the atomic binding force, and the other is the volume of material. Therefore, the relationship between Young's modulus and temperature can be empirically determined.

That is, by adjusting the Young's modulus of the bond material, the bond material may be tailored to accommodate the stresses and strains that an electronic assembly may experience through use such that the bond material may operate in an elastic region and minimize the occurrences of stress and/or strain beyond the yield point. The yield point of a material defines the point at which the stress-strain curve of a material crosses over from elastic behavior into plastic behavior (i.e., plastic deformation). Prior to the yield point, material will deform elastically and should return to its original shape when the applied stress is removed. Once the yield point of a material is passed, some fraction of the deformation becomes permanent and non-reversible. Such permanent and non-reversible deformation can result in the degradation of the material, which can contribute to the loss in thermal and/or electrical conductivity of the material in addition to a loss in mechanical strength and/or a bond formed with the material.

In general, the Young's modulus of a component is determined by the materials that form the component. However, as described in more detail herein, changes to the thickness, porosity, and geometry (i.e., shape and size of pores or openings within the material) of a bond layer can affect the Young's modulus of a component and may be utilized to tune the Young's modulus of a component, more particularly, a mesh bond material utilized as a mesh bond layer in an electronic assembly.

As described in more detail herein, the geometry (i.e., the shape and size) of the mesh bond material can be controlled to tune the Young's modulus of the mesh bond material. Since the Young's modulus is related to the amount of stress produced in the mesh bond material (e.g., from volume expansion and contraction due to temperature), to reduce the stress and/or strain produced, the porosity (e.g., the density) and geometry (e.g., the shape and/or size) of openings in the mesh bond material can be controlled to tune the Young's modulus of the mesh bond material. As referred to herein, the "size" of an opening or a predefined number of openings may refer to the void volume an opening or a predefined number of openings form within the mesh bond material, unless another measure or unit is otherwise specified. Additionally, as described in more detail herein, the shape of the mesh bond material (e.g., square, circle, or the like) can be controlled to further tune the Young's modulus.

In particular, by introducing openings in an otherwise solid bond layer by forming and using a mesh bond material, the effect of localized stress concentrations within the electronic assembly may be minimized or eliminated. That is, the openings formed within the mesh bond material allows the mesh bond material to locally expand and contract into the space provided by the openings. As such, stress concentrations may be relieved locally, thereby affecting a smaller portion of the bond material making up the bond layer as compared to a solid bond layer that does not provide localized stress relief (i.e., openings) for the bond material to expand and contract within while minimizing the impact on the entire bond layer and components bonded thereto.

Additionally, by forming a mesh bond material as a composite of materials, the Young's modulus, thermal conductivity, and electrical conductivity of the mesh bond layer may be adjusted to facilitate the desirable bond layer parameters for an electronic assembly. For example, the introduction of an opening within a bond layer utilizing a mesh bond material may reduce the Young's modulus of the bond layer, thereby providing localized stress relief and may also reduce the thermal conductivity of the bond layer utilizing a mesh bond material as compared to a solid bond layer. However, thermal conductivity properties of the mesh bond material may be improved by forming the mesh bond material with a composite of materials. For example, the thermal conductivity of a solid bond layer made of an aluminum alloy may be reduced by introducing holes therein. However, by including a layer or core of copper the thermal conductivity of the mesh bond material having a layer or core of copper and one or more layers or cladding of aluminum may approach or be the same as a solid bond layer made of the aluminum alloy, but including openings that provide localized stress relief.

In some embodiments, the introduction of openings within a solid bond layer (e.g., made of an aluminum alloy) forms a mesh bond layer and the introduction of openings may reduce or change the electrical conductivity of the bond layer. Additionally, the current density may increase in portions of the mesh bond layer because the presence of openings reduces the amount of material within the bond layer for electrical conductance as compared to a solid bond layer. However, by forming a mesh bond material for use as a mesh bond layer with a composite of materials the electrical conductivity of the bond layer utilizing a mesh bond material may be increased. For example, a mesh bond layer made of an aluminum alloy may exhibit an increase in electrical conductance if materials with an electrical conductance greater than the aluminum alloy are introduced, such as copper, as compared to a mesh bond layer made only of aluminum. The addition or formation of the mesh bond material for the mesh bond layer having a composite of aluminum alloy and copper may increase the electrical conductivity of a mesh bond layer to account for the presence of less conductive material than a solid bond layer. Therefore, a mesh bond material when used as a mesh bond layer may achieve electrical and thermal characteristics similar to or better than a solid bond layer while also providing localized stress relief through the presence of openings, which allow the bond layer to locally expand and contract.

Various embodiments of mesh bond materials and methods for forming mesh bond materials and their use in electronic assemblies to reduce stress concentrations in the bond layer between a semiconductor device and a substrate are now described herein below.

Referring now to the drawings, FIG. 1A schematically depicts a perspective view of an illustrative electronics assembly 100 having a mesh bond layer 110. An electronic assembly 100 may include a substrate 102 bonded to a semiconductor device 105 by a mesh bond layer 110 is shown and described herein. The mesh bond layer 110 may have a first surface 111 spaced apart by a thickness of material from a second surface 112 that is opposite the first surface 111. The first surface 111 of the mesh bond layer 110 may be bonded to a top surface 103 of the substrate 102. The second surface 112 of the mesh bond layer 110 may be bonded to a bottom surface 104 of the semiconductor device 105. The bonds provide a mechanical, electrical, and thermal joint between the substrate 102 and the mesh bond layer 110 and the mesh bond layer 110 and the semiconductor device 105. The bonds between the substrate 102 and the mesh bond layer 110 and the semiconductor device 105 and the mesh bond layer 110 may be formed through one of a variety of techniques, such as solder reflow, wave soldering, laser soldering, ultrasonic bonding, thermosonic bonding, TLP bonding, and the like.

Reflowing solder is a process in which a solder paste (e.g., a sticky mixture of powdered solder and flux) may be used to temporarily attach one or several electrical components to the mesh bond material and/or to other component surfaces, after which the entire electronic assembly 100 is subjected to controlled heat, which melts the solder, thereby permanently connecting the components of the electronic assembly 100. In some instances, heating the solder may be accomplished by passing the electronic assembly 100 through a reflow oven, under an infrared lamp or by soldering individual joints with a hot air pencil. In general, reflow soldering is a method of attaching surface mount components to a circuit board, although it can also be used for through-hole components by filling the holes with solder paste and inserting the component leads through the paste. The goal of the reflow process is to melt the solder and heat the adjoining surfaces, without overheating and damaging the electrical components. In the conventional reflow soldering process, there are usually four stages, called "zones", each having a distinct thermal profile: preheat, thermal soak (often shortened to just soak), reflow, and cooling that the assembly is passed through.

In some embodiments, the components of an electronic assembly 100 may be joined through a process known as wave soldering. In general, wave soldering is a bulk soldering process used in the manufacture of printed circuit boards. A circuit board may be passed over a pan of molten solder in which a pump produces an upwelling of solder that looks like a standing wave. As the circuit board with electronic components makes contact with this wave, the electronic components become soldered to the board. Wave soldering may be used for through-hole printed circuit assemblies and surface mount components, such as joining the surface of an electric component to a mesh bond material and semiconductor or substrate. To assure the placement of the components onto the surface of a printed circuit board (PCB) by placement equipment, the components may be glued onto the surface of the PCB before being run through the molten solder wave.

As described above, the components of the electronic assembly 100 may be joined by TLP bonding, whereby a low melting temperature material is diffused into a high melting temperature material at a sintering temperature to form intermetallic compounds having a high remelting temperature.

Figure 1B:
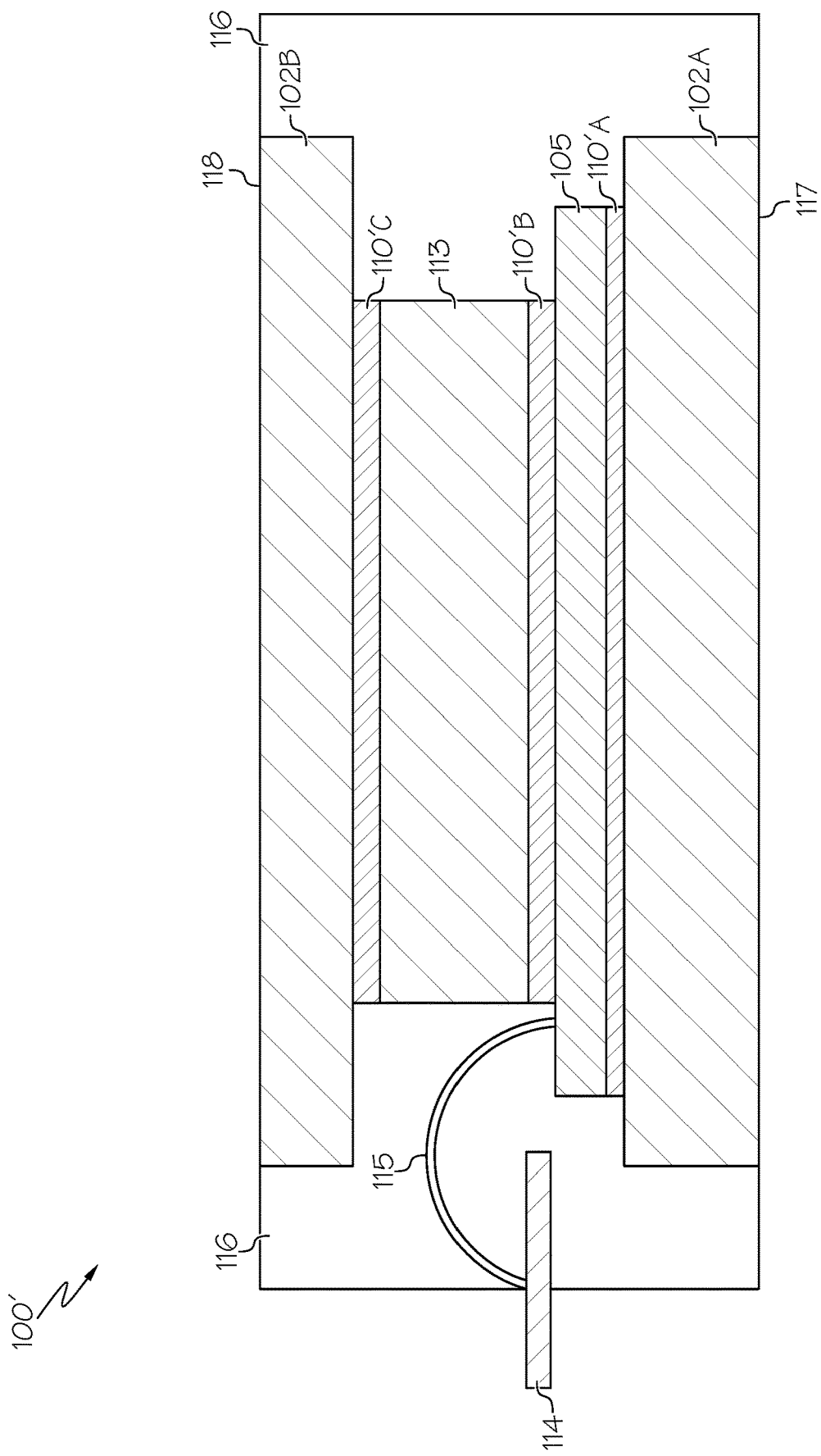
FIG. 1B schematically depicts a cross-sectional view of the illustrative electronics assembly having a mesh bond material, according to one or more embodiments shown and described herein.
Figure 1C:
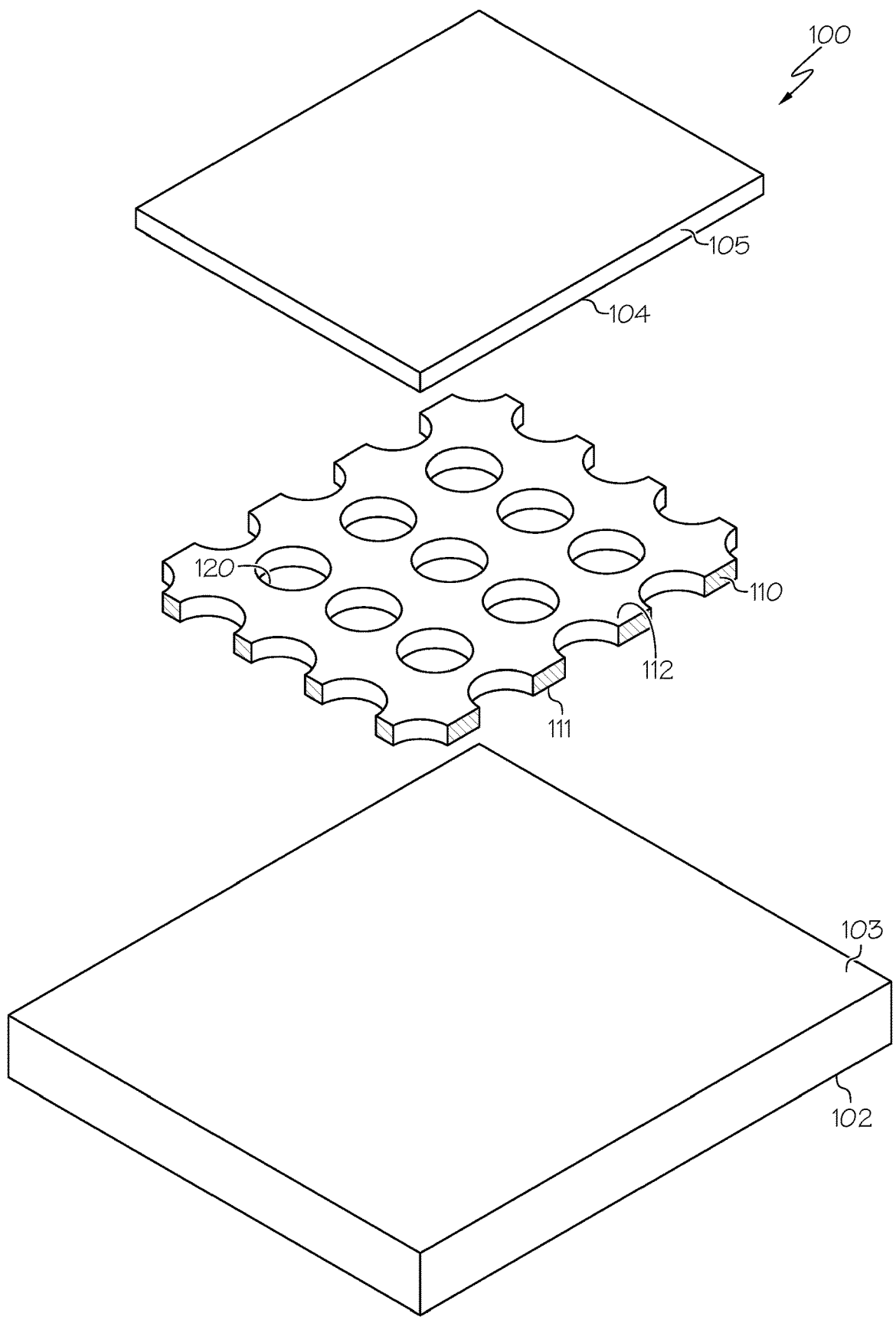
FIG. 1C schematically depicts an exploded view of the illustrative electronics assembly having a mesh bond material, according to one or more embodiments shown and described herein.

Referring now to FIG. 1B, an illustrative double-sided electronics assembly 100' is depicted. In some embodiments, the double-sided electronics assembly 100' may form an electronic device having, for example, a semiconductor 105 positioned within a stack of electrically and/or thermally coupled components. The double-sided electronics assembly 100' may be any semiconductor device having a stack of materials forming an electronic device such as a power electronics device, a wide band gap device, a transistor with an emitter, a collector, and a gate, or the like. FIG. 1B, depicts only one possible embodiment of a double-sided electronics assembly 100' and should not be limited to such components and configuration.

Referring to the double-sided electronics assembly 100' depicted in FIG. 1B, a semiconductor 105 may form one or more layers positioned between one or more additional layers including one or more substrates 102 (e.g., 102A and 102B), one or more bond layers 110' (e.g., 110'A, 110'B, and 110'C), one or more spacer layers 113, and/or the like. For example, and without limitation, a first substrate 102A is bonded to a semiconductor 105 by a bond layer 110'A. The one or more bond layers 110' (e.g., 110'A, 110'B, and 110'C), may include a solder layer, a mesh bond layer, as described in more detail herein, a combination thereof, or the like. The semiconductor 105 may further be bonded, with a second bond layer 110'B, to a spacer layer 113 including a spacer material that is capable of electric and thermal conduction. For example, the spacer material may include at least one of a material such as copper, aluminum, gallium, or any other metal, alloy, or compound that is capable of electric and/or thermal conduction. The spacer layer 113 may further be bonded, with a third bond layer 110'C to a second substrate 102B. The first substrate 102A and the second substrate 102B may be a semiconductor material, an electrode, or the like. In some embodiments, the first substrate 102A may be a collector terminal of a semiconductor device and the second substrate 102B may be an emitter terminal of a semiconductor device (e.g., the double-sided electronics assembly 100'). Additionally, the double-sided electronics assembly 100' may include a gate electrode 114 coupled directly to or via a wire 115 to the semiconductor 105. In some embodiments, a signal such as a gate voltage may be applied to the gate electrode 114 to cause the semiconductor 105 to conduct such that the first substrate 102A and the second substrate 102B may be electrically coupled (i.e., current may flow from the first substrate 102A and the second substrate 102B or vice versa).

Still referring to FIG. 1B, the double-sided electronics assembly 100' may include a resin 116 configured to provide a supporting structure or package to the components of the double-sided electronics assembly 100'. Additionally, the double-sided electronics assembly 100' may be coupled to a cooler on a first surface 117 and/or a second surface 118 of the double-sided electronics assembly 100'. The cooler, while not depicted, may include a heat sink, a liquid phase cooling apparatus, either active (e.g., utilizing jet channels and pumps) or passive (e.g., utilizing thermal convection, conduction, radiation, including processes such as nucleation or the like) a combination of both, or any other cooler device capable of extracting heat from the double-sided electronics assembly 100'.

Referring now FIG. 1B, an exploded view of the illustrative electronics assembly 100 from FIG. 1A having a mesh bond layer 110 is depicted. The mesh bond layer 110 may be a composite material having one or more metals forming a mesh bond material, which is described in more detail herein. For example, the mesh bond layer 110 may include copper (Cu), gold (Au), nickel (Ni), tin (Sb), or any other metal or alloy suitable for the chosen bonding technique and to obtain the desired Young's modulus. The material may be an electrically and thermally conductive material such that electrical energy and thermal energy may be freely transported between the semiconductor device 105 and the substrate 102 through the mesh bond layer 110. The semiconductor device 105 may be any device such as a power electronic device, integrated circuit package, wide band gap power electronic device (e.g., insulated-gate bipolar transistors (IGBTs), power diodes, power metal-oxide-semiconductor field-effect transistors (MOSFETs), power transistors, and the like), a discrete component such as a resistor or capacitor or any other electronic device. In some embodiments, the semiconductor device 105 may be formed from wide band gap semiconductor materials including without limitation silicon carbide (SiC), aluminum nitride (AlN), gallium nitride (GaN), boron nitride (BN), diamond, and the like. In embodiments, the semiconductor device 105 may comprise a coating, e.g., nickel (Ni) plating, to assist in the TLP bonding of the semiconductor device 105 to the substrate 102.

The substrate 102 may be a printed circuit board, another semiconductor device 105, an electrode, a metal plate (e.g., a copper plate, a nickel plate, an aluminum plate and the like), a wire or any material for bonding to a semiconductor device 105. As shown in FIG. 1B, the mesh bond layer 110 generally includes a planar shape with a plurality of openings 120 extending through the mesh bond layer 110. The plurality of openings 120 provide void space within the mesh bond layer 110, thereby reducing the amount of material affected by expansion or contraction due to variations in temperature, for example, as a result of heat generated by the semiconductor device 105 bonded thereto. In general, electronic assemblies may be subjected to a predefined range of temperatures from minus 40 degrees C. to 85 degrees C. However, in some instances, electronic assemblies or individual bonds or components within an electronic assembly may be subjected to a predefined range of temperatures of about minus 55 degrees C. to about 125 degrees C. or greater during operation. In some instances, electronic assemblies may be subjected to temperatures of about minus 60 degrees C., about minus 50 degrees C., about minus 40 degrees C., about minus 30 degrees C., about minus 20 degrees C., about minus 10 degrees C., about 0 degrees C., about 25 degrees C., about 50 degrees C., 75 degrees C., 100 degrees C., 125 degrees C., 150 degrees C., 175 degrees C., 200 degrees C., 225 degrees C., 250 degrees C., 275 degrees C., 300 degrees C., 325 degrees C., 350 degrees C., 400 degrees C., or any value therebetween. Additional details regarding the plurality of openings 120 will be described in greater detail herein.

Figure 2A:
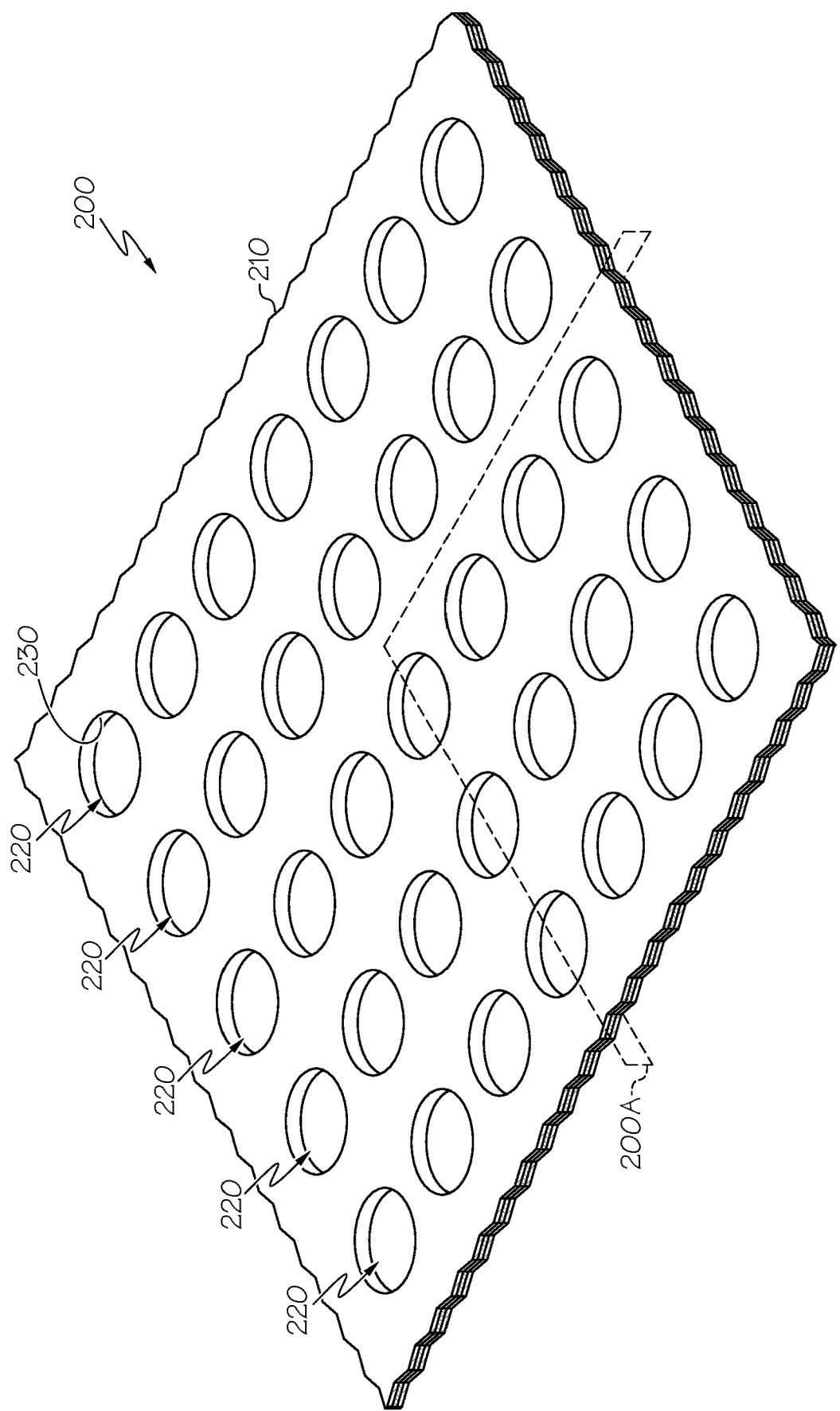
FIG. 2A depicts a perspective view of an illustrative mesh bond material, according to one or more embodiments shown and described herein.
Figure 2B:
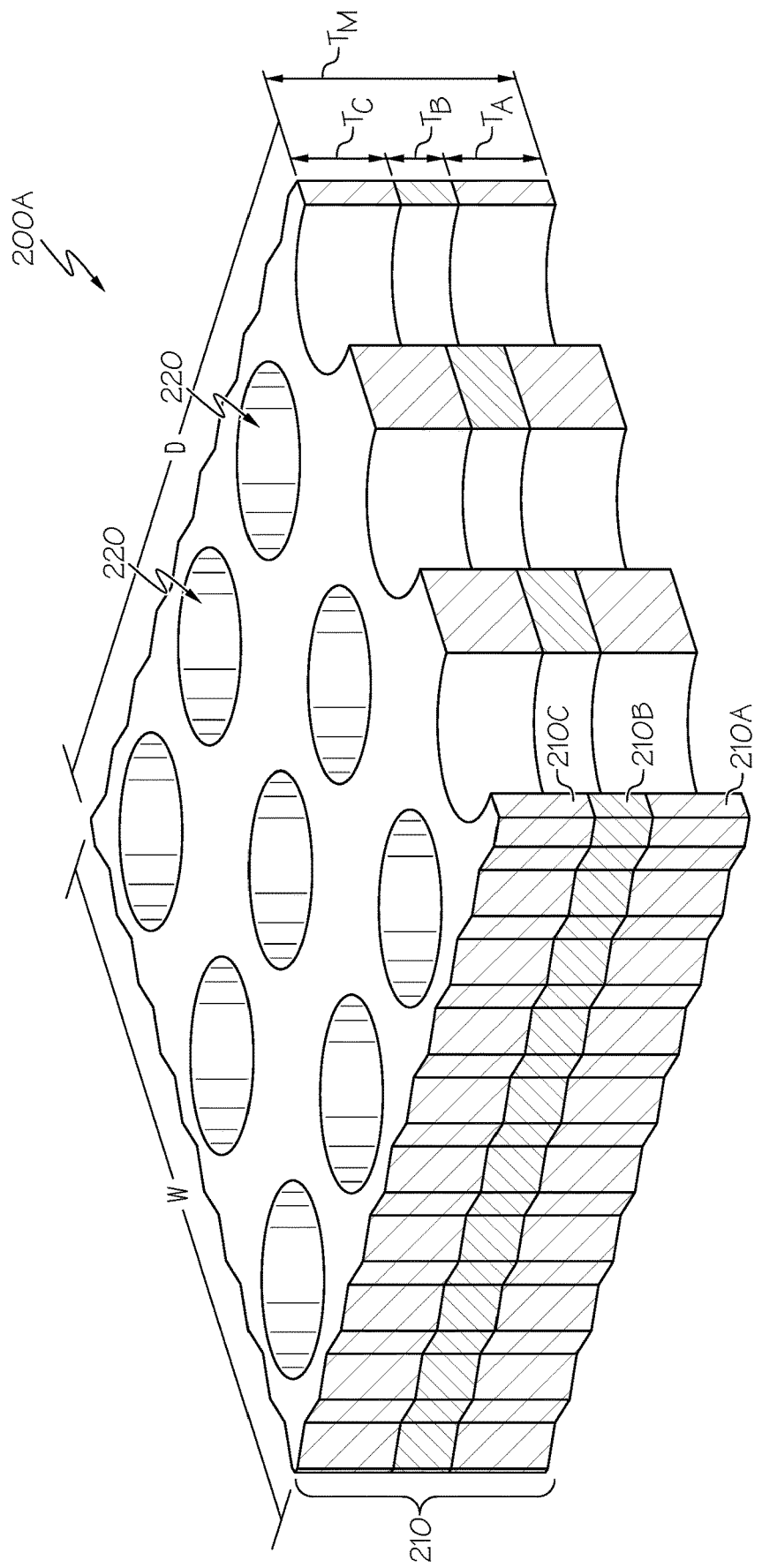
FIG. 2B depicts a cross section view of a portion of the mesh bond material illustrated in FIG. 2A, according to one or more embodiments shown and described herein.

Referring now to FIGS. 2A and 2B, perspective views of an illustrative example of a bond layer 200 in the form of a mesh bond material 210 having a plurality of openings 220 is depicted. In FIG. 2A, the mesh bond material 210 may be formed from one or more layers of material. As depicted, the plurality of openings 220 in the mesh bond material 210 have a shape 230 that is circular. However, the shape 230 of the plurality of openings 220 may be any closed contoured shape such as a square, rectangle, triangle, hexagon, an irregular polygon or the like. The shape 230 may be selected based on the predetermined Young's modulus of the mesh bond material 210 to reduce the stress concentrations of the electronic assembly. The one or more shapes that make up the openings of the mesh bond material 210 provide defined areas of material of the mesh bond material where the expansion and contraction of the mesh bond material 210 may occur. For example, depending on the thermal profile of a semiconductor device bonded to the mesh bond material 210, a square opening may be more desirable than a circle because a uniform amount of mesh bond material 210 may be present between the square shape openings. In other embodiments, the implementation of a circle shape opening may provide more lateral structural support (i.e., resistance to expansion or contraction) to the mesh bond material 210 than a square shape opening. Circles and squares are only two example shapes, which may be utilized for openings 220 of the mesh bond material 210.

In some embodiments, a combination of various shapes may define the openings 220 of the mesh bond material. For example, configurations such as providing triangular openings arranged in a circular configuration about a hot spot with one vertex of each triangular opening directed to the center of a known hot spot of a semiconductor device may provide a radial wicking structure with openings 220 adjacent to the radially extending material from the hot spot that allow for expansion and contraction of the mesh bond material of the mesh bond layer. That is, the particular geometry (e.g., shape and size) of the openings 220 may be determined based on the stress and/or strains generated by the thermal expansion and contraction induced by the semiconductor device bonded to the mesh bond layer. Formation of a mesh bond material will be described in more detail herein.

Additionally, the quantity and location of the plurality of openings 220 within the mesh bond material 210 may be controlled to adjust the Young's modulus of the mesh bond material 210. For example, a first mesh bond material having few openings 220 and/or openings 220 spaced farther apart from each other may have a Young's modulus that is greater than a second mesh bond material having many openings 220 spaced close to one another. That is, generally as the density of openings 220 increases (i.e., as the amount of material of the mesh bond material decreases) the mesh bond material may require less stress or strain to deform and may be able to expand and contract more without permanent deformation or fracture. In other words, an increase in the number of openings 220 within the mesh bond material 210 may result in a decrease of the Young's modulus of the mesh bond material 210.

Turning to FIG. 2B, a cross section 200A view of a portion of the illustrative mesh bond material 210 depicted in FIG. 2A is shown. As depicted in FIG. 2B, the mesh bond material 210 is depicted as a composite material having three layers of material (210A, 201B, and 210C). In some embodiments, the mesh bond material 210 may be formed with two or more layers of material each having a predefined or overall thickness $T_M$ (i.e., comprising the thickness of each composite layer, $T_A$, $T_B$, and Tc). For example, a first layer 210A may have a thickness of $T_A$, a second layer 210B may have a thickness of $T_B$, and a third layer 210C may have a thickness of Tc. The Young's modulus of the mesh bond material 210 may be adjusted by controlling the amount and/or thickness of each layer and the material used for each layer. For example, the first layer 210A and third layer 210C may be Ni or another metal or alloy and the second layer 210B may include Cu, Au or another metal or alloy. That is, the mesh bond material 210 can include a layer of metal, such as Cu or Au disposed between two layers of Ni. To modify the Young's modulus of the mesh bond material 210 in order to reduce stress concentrations, the thickness of one or more of the layers of the composite of the mesh bond material 210 may be adjusted. For example, the thickness $T_B$ of the second layer 210B may be increased or decreased to increase or decrease the Young's modulus of the mesh bond material 210. By way of another example, one or both of the thicknesses ($T_A$ and/or $T_B$) of the first layer 210A and the second layer 210B may be increased or decreased to increase or decrease the Young's modulus of the mesh bond material 210. Furthermore, one or both of the thicknesses ($T_B$ and/or Tc) of the second layer 210B and the third layer 210C may be increased or decreased to increase or decrease the Young's modulus of the mesh bond material 210.

Changing the thickness of each material in a layered composite material such as the above described mesh bond material, causes the amounts and distribution of each material present in the mesh bond material to change as well. In general, the Young's modulus of a composite material follows the law of mixtures. The law of mixtures as applied to the Young's modulus of a composite material generally states that the Young's modulus of a composite material is the sum of the value of the Young's modulus of each constituent material multiplied by its respective volume fraction or weight fraction in the mixture (i.e., composite material). The volume fraction of a material within a composite material such as a mesh bond material is the volume of that material divided by the volume of the composite material. Similarly, the weight fraction of a material within a composite material such as a mesh bond material is the weight of that material divided by the weight of the composite material.

Therefore, when designing a composite material to achieve a predefined Young's modulus for implementation as a mesh bond material, the Young's modulus of each material in proportion to their amount and the overall geometry of the resulting mesh bond material may be considered. For example, if a mesh bond material is constrained to a specific overall thickness $T_M$, width W, and depth D, and a Young's modulus of a predetermined value is known, then the parameters including the type of material, the individual thickness of each composite material as well as the volume of material removed by the openings 220 may be adjusted to design a composite mesh bond material with the predetermined Young's modulus.

In some embodiments, the Young's modulus of each layer of the composite of the mesh bond material 210 may be configured to exhibit a different Young's modulus. For example, the first layer 210A and the third layer 210C may have the same Young's modulus while the second layer 210B may have a different Young's modulus. The first layer 210A and the second layer 210B may have the same Young's modulus while the third layer 210C has a different Young's modulus. In some embodiments, the Young's modulus of the second layer 210B may be less than the Young's modulus of one or both of the Young's moduli of the first layer 210A and the third layer 210C. The Young's modulus of the second layer 210B may be greater than the Young's modulus of one or both of the Young's moduli of the first layer 210A and the third layer 210C. In another embodiment, the Young's modulus of the first layer 210A may be less than or greater than the Young's modulus of one or both of the Young's moduli of the second layer 210B and the third layer 210C. In yet another embodiment, the Young's modulus of the first layer 210A may be less than the Young's modulus of the second layer 210B and the Young's modulus of the second layer 210B may be less than the Young's modulus of the third layer 210C.

The mesh bond material 210 may be formed using processes such as electrodeposition (e.g., electroplating), molding, physical vapor deposition, chemical deposition, laser metal deposition, additive manufacturing processes, or any other known or yet to be developed deposition process. Once formed, the mesh bond material 210 may be adjusted or further tuned to achieve a predefined Young's modulus. The adjusting or tuning of the mesh bond material 210 may include post processes such as rolling or compressing to reduce the thickness of the mesh bond material 300 and the composite layers or cores therein. The mesh bond material 210 may also be adjusted by post processing the material with a laser cutting, etching or machining process to change the geometry (i.e., the size and/or shape) of the one or more openings 220 of the mesh bond material 210.

Figure 2C:
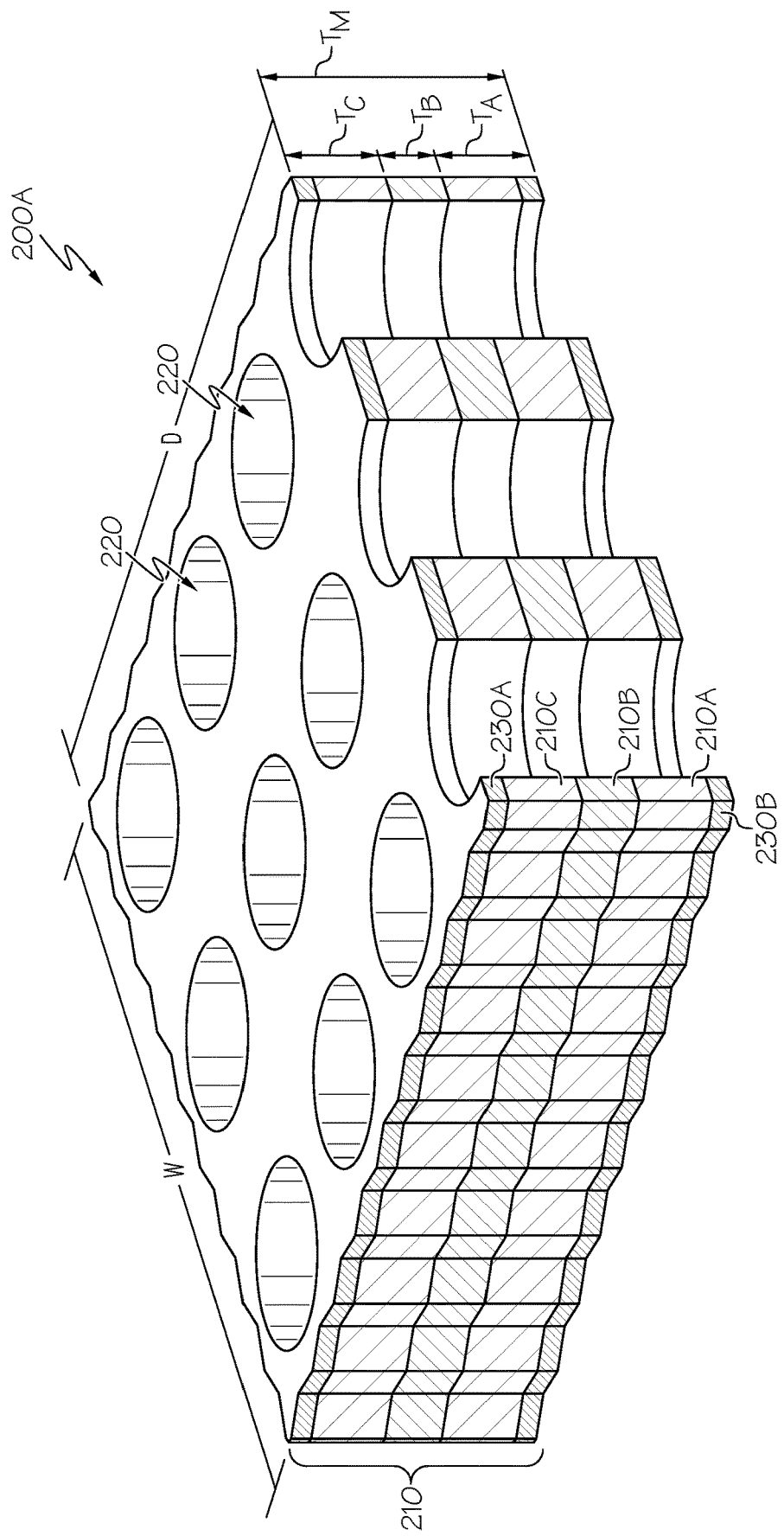
FIG. 2C depicts a cross section view of a portion of the mesh bond material illustrated in FIG. 2A having layers of bond material such as tin, according to one or more embodiments shown and described herein.

In some embodiments, the mesh bond material may include one or more additional layers. Turning to FIG. 2C, another cross section view of a portion of the mesh bond material illustrated in FIG. 2A is depicted. For example, the composite of the mesh bond material may be coated with one or more coating layers 230A and 230B of tin (Sn), lead (Pb), and/or antimony (Sb), a combination thereof or another metal or metal alloy for bonding to the semiconductor device and substrate of an electronic assembly. In general, the coating layers 230A and 230B may have a minimal thickness and therefore may have a negligible effect on the Young's modulus of the mesh bond material. The coating layers 230A and 230B facilitate bonding between the mesh bond material and one or more of a semiconductor device, substrate, electrode, wire, or the like. The coating layers 230A and 230B may be provided as a paste or as layers in the mesh bond material. For example, a mesh bond material may be formed by a method described herein and then be subjected to a post-process where one or more coating layers 230A and 230B are applied. In some embodiments, the coating layers may be formed integrally with the formation of the mesh bond material, for example, as described in one embodiment with reference to FIG. 8.

Figure 2D:
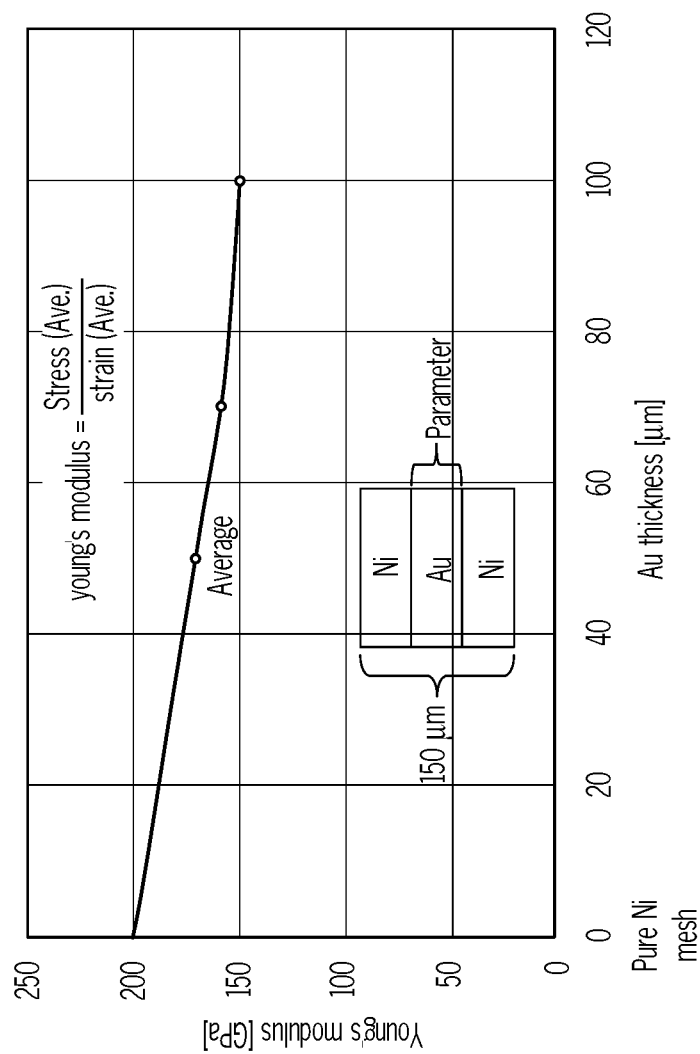
FIG. 2D depicts a graph of an illustrative relationship between the amount/thickness of a layer of the composite of the mesh bond material to the Young's modulus of the mesh bond material, according to one or more embodiments shown and described herein.

As briefly discussed above, the Young's modulus of the mesh bond material 210 may be determined by the thickness and/or amount of material in each layer of the composite of the mesh bond material. For example, stress relief (i.e., a reduction in stress in the mesh bond material) may be achieved by increasing the amount and/or thickness of the second layer 210B comprising Au. As depicted in FIG. 2D, a graph of an illustrative relationship between the amount and/or thickness of a layer of the composite of the mesh bond material to the Young's modulus of the mesh bond material is shown. For example, the changes to the Young's modulus of mesh bond material having a composite including a Ni/Au/Ni structure is depicted in FIG. 2D. The overall thickness of the mesh bond material is 150 um. By adjusting the thickness of the Au layer (e.g., the second, middle, layer), the Young's modulus of the mesh bond material is tuned. As shown in FIG. 2D, increasing the thickness of the Au layer (which reduced the thickness and amount of Ni in the composite) reduces the Young's modulus of the mesh bond material. Additionally, the amount and/or thickness of the Au layer (e.g., the second layer 210B) in the mesh bond material may also control the thermal conductivity of the mesh bond layer. That is, by increasing the Au layer, (e.g., the second layer 210B) the thermal conductivity of the mesh bond material may be increased. While Au is used as the example material for the second layer 210B, Cu or other metals and/or alloys may be used.

Figure 3A:
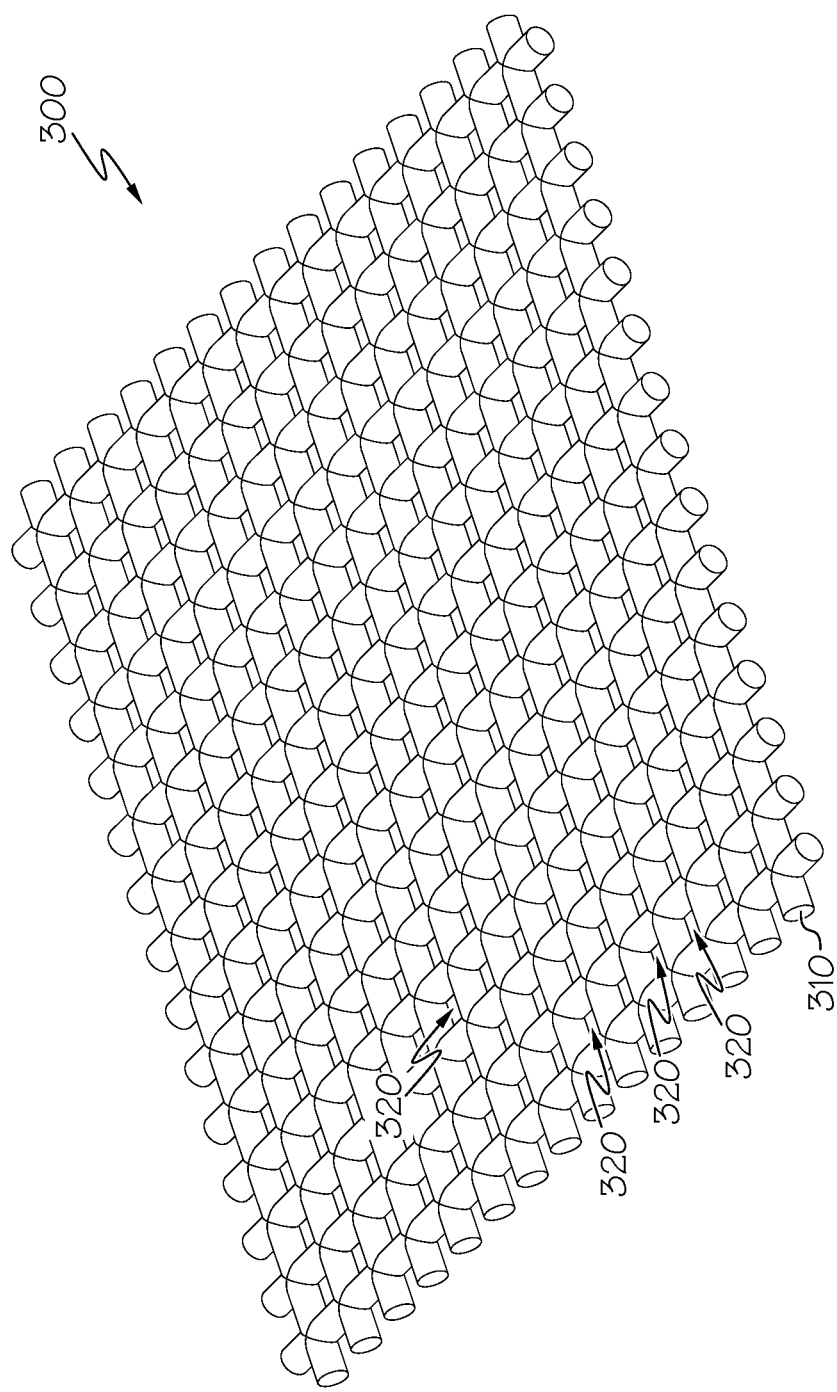
FIG. 3A depicts a perspective view of another illustrative mesh bond material, according to one or more embodiments shown and described herein.
Figure 3B:
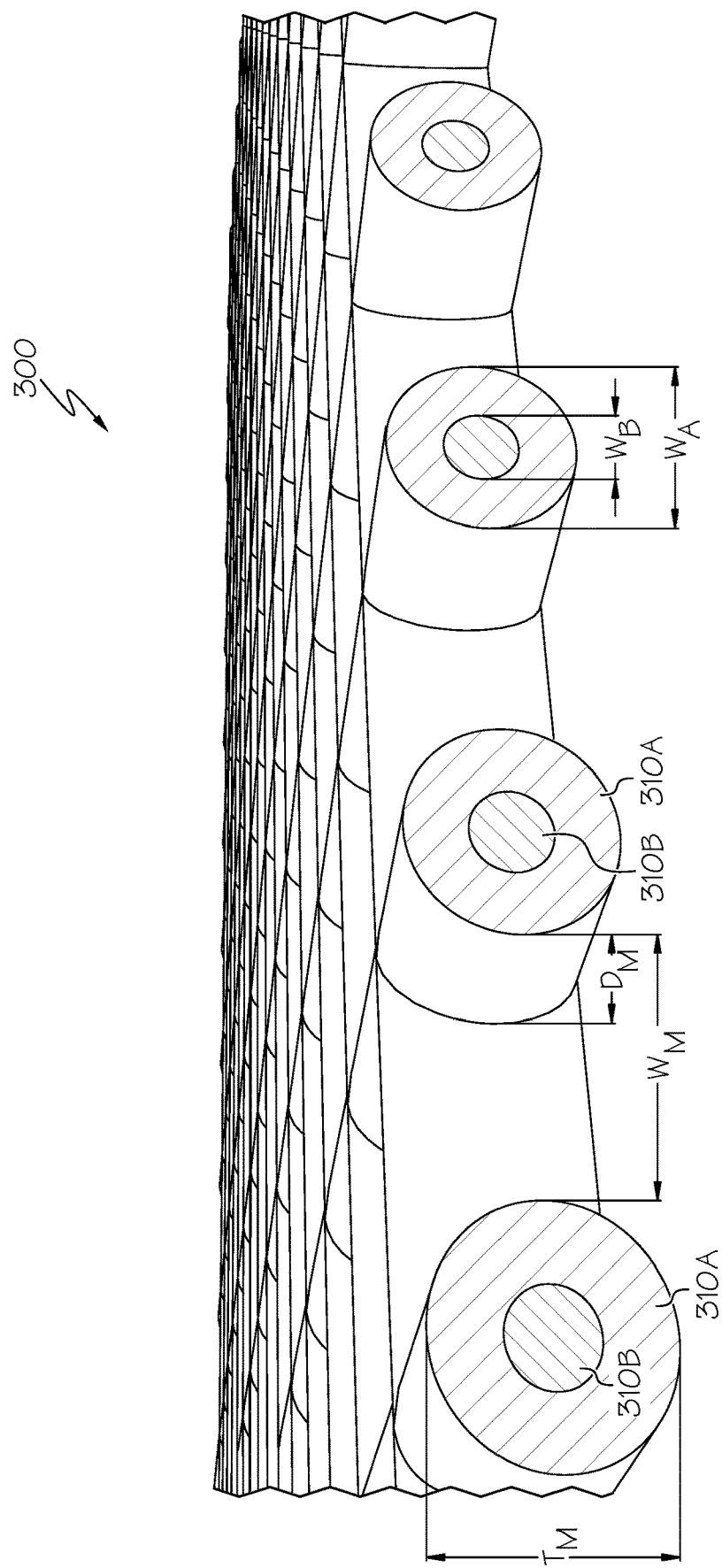
FIG. 3B depicts an illustrative view of the example composition and structure of the mesh bond material illustrated in FIG. 3A, according to one or more embodiments shown and described herein.

Referring now to FIGS. 3A and 3B, another illustrative mesh bond material 300 is depicted. The mesh bond material 300 depicted in FIGS. 3A and 3B illustrates a mesh bond material 300 having a wire-like frame 310 defining a plurality of openings 320 having a generally square shape. However, the plurality of openings 320 may have any closed contoured shape such as a circle, rectangle, triangle, diamond, hexagon, an irregular polygon, or the like. In embodiments, a mesh bond material 300 may be made of a single metal or more than one metal. As shown in FIG. 3B, the mesh bond material 300 includes a two layers 310A and 310B which form the composite of the mesh bond material 300. In some embodiments, a first layer 310A (e.g., a first metal) may encase (e.g., completely surround) a second layer 310B (e.g., a second metal). Similar to the mesh bond material 210 depicted and described with respect to FIGS. 2A-2C, the mesh bond material 300 in FIGS. 3A-3B has an overall thickness $T_M$ and exhibits a Young's modulus. The Young's modulus of the mesh bond material 300 may be modified by adjusting (i) the thickness $T_M$ of the mesh bond material 300, (ii) the thickness of a layer of the composite of the mesh bond material 300, (iii) a geometry of the one or more openings 320, or (iv) a size ($W_M$, $D_M$) of the one or more openings 320 of the mesh bond material 300. That is, the thickness $T_M$ of the mesh bond material 300 may be adjusted during formation (e.g., through electrodeposition, molding, additive processes or the like) of the mesh bond material 300. The mesh bond material 300 may be formed using processes such as electrodeposition (e.g., electroplating), molding, physical vapor deposition, chemical deposition, laser metal deposition, additive manufacturing processes, or any other known or yet to be developed depositions process.

Once formed, the mesh bond material 300 may be adjusted or further tuned to achieve a predefined Young's modulus. The adjusting or tuning of the mesh bond material 300 may include post processes such as rolling or compressing to reduce the thickness of the mesh bond material 300 and the composite layers or cores therein. The mesh bond material 300 may also be adjusted by post processing the material with a laser cutting, etching or machining process to change the geometry (i.e., the size and/or shape) of the one or more openings 320 of the mesh bond material 300.

Similar to the mesh bond material depicted and described with respect to FIGS. 2A-2C, to modify the Young's modulus of the mesh bond material 300 in order to reduce stress concentrations, the thickness of the one or more of the layers of the composite of the mesh bond material 300 may be adjusted. For example, the width $W_B$ (e.g., also referred to as the thickness) of the second layer 310B (i.e., also referred to as the core) may be increased or decreased to increase or decrease the Young's modulus of the mesh bond material 300.

Still referring to FIGS. 3A-3B, the Young's modulus of each layer of the composite of the mesh bond material 300 may have a different Young's modulus such that the Young's modulus of the mesh bond material 300 is the resultant combination of each of the Young's moduli making up the composite, in some embodiments. For example, the first layer 310A and the second layer 310B may have the same Young's modulus. However, in some embodiments, the Young's modulus of the core (i.e., the second layer 310B) may be greater than the Young's modulus of the outer layer (i.e., the first layer 310A). Alternatively, the Young's modulus of the core (i.e., the second layer 310B) may be less than the Young's modulus of the outer layer (i.e., the first layer 310A). As described above, the Young's modulus of a material may initially be designed and/or determined based on the law of mixtures which as applied to Young's modulus generally states that the Young's modulus of a composite material is the sum of the value of the Young's modulus of each constituent material multiplied by its respective volume fraction or weight fraction in the mixture (i.e., composite material).

In some embodiments, the Young's modulus of the mesh bond material 300 may be modified by adjusting the size (i.e., the dimensions) of the plurality of openings 320. For example, the depth $D_M$ and/or the width $W_M$ of the openings 320 may be increased or decreased thereby changing the size of the plurality of the openings 320 of the mesh bond material 300. In some embodiments, an increase in the size of the plurality of openings 320 of the mesh bond material 300 decreases the Young's modulus of the mesh bond material 300. The decrease is generally due to the removal of material from the bond layer such that one or more lateral dimensions of the material may absorb and react to stresses and strains more effectively than a solid bond layer.

Figure 4:
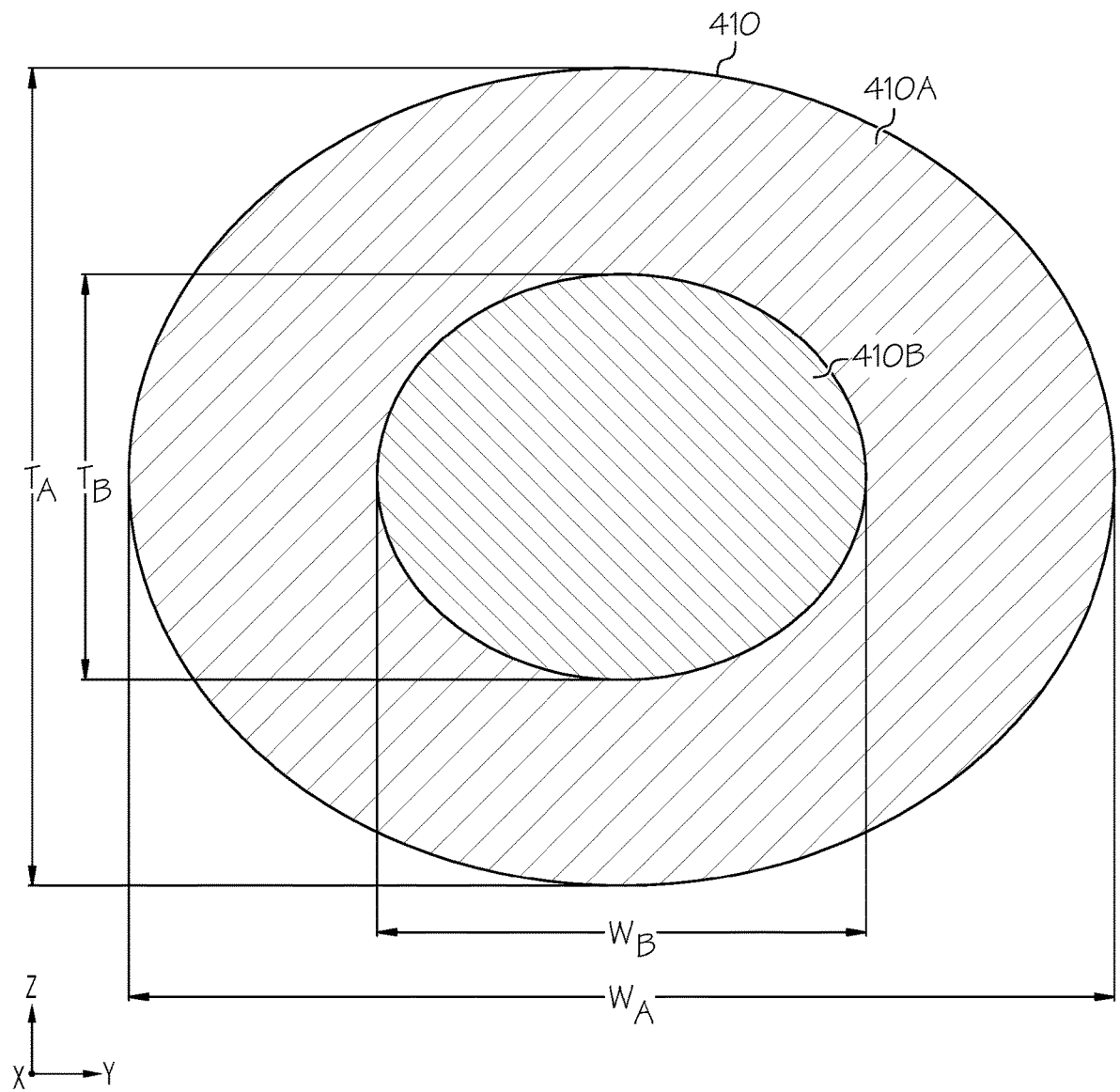
FIG. 4 depicts a cross section view of a portion of an illustrative mesh bond material, according to one or more embodiments shown and described herein.

Referring now to FIG. 4, another illustrative cross section view of a portion of an illustrative mesh bond material 410 is depicted. The cross section of the illustrative mesh bond material 410 depicts an example where the cross section is a shape other than a circle. In such an instance, the thickness $T_A$ and/or the width $W_A$ of the mesh bond material 410 may be adjusted to modify the Young's modulus of the mesh bond material 410. Similarly, the thickness $T_B$ and/or the width $W_B$ of core (e.g., the second layer 410B) of the composite of the mesh bond material 410 may be adjusted to modify the Young's modulus of the mesh bond material 410. In addition to modifying the thickness $T_B$, and/or the width $W_B$, of the core (e.g., the second layer 410B), the thickness and/or the width of outer layer (e.g., the first layer 410A) may be adjusted to maintain or adjust the thickness $T_A$ and/or the width $W_A$ of the mesh bond material 410. In some embodiments, the core may have a Young's modulus that is greater than the outer layer. In other embodiments, the core may have a Young's modulus that is less than the outer layer.

The Young's modulus of a material (e.g., a mesh bond material having copper (Cu), gold (Au), nickel (Ni), tin (Sb), or any other metal or alloy suitable for the chosen bonding technique and to obtain the desired Young's modulus) may be dimensionally dependent. As such, by adjusting the dimensions of the materials of a composite material, for example, changing the amount of the material in a particular dimension (e.g., the dimension in which a stress and/or a strain is applied to the material) the composite material can provide an improved response to the stress and/or strain without permanently deforming. For example, as depicted in FIG. 4, if the amount of material in the second layer 410B is increased in the X and Y dimensions and decreased in the Z direction, (e.g., through a rolling process) the Young's modulus of the material in the X and Y dimensions may be adjusted to accommodate the stresses and/or strains of thermal expansion and/or contraction in the X and Y dimensions (i.e., planar or lateral directions with respect to the surfaces of a semiconductor and/or substrate bonded thereto). As discussed above, bonding the mesh bond material to the surfaces of a semiconductor and/or substrate may include a process such as solder reflow, wave soldering, laser soldering, ultrasonic bonding, thermosonic bonding, TLP bonding or the like.

Figure 5:
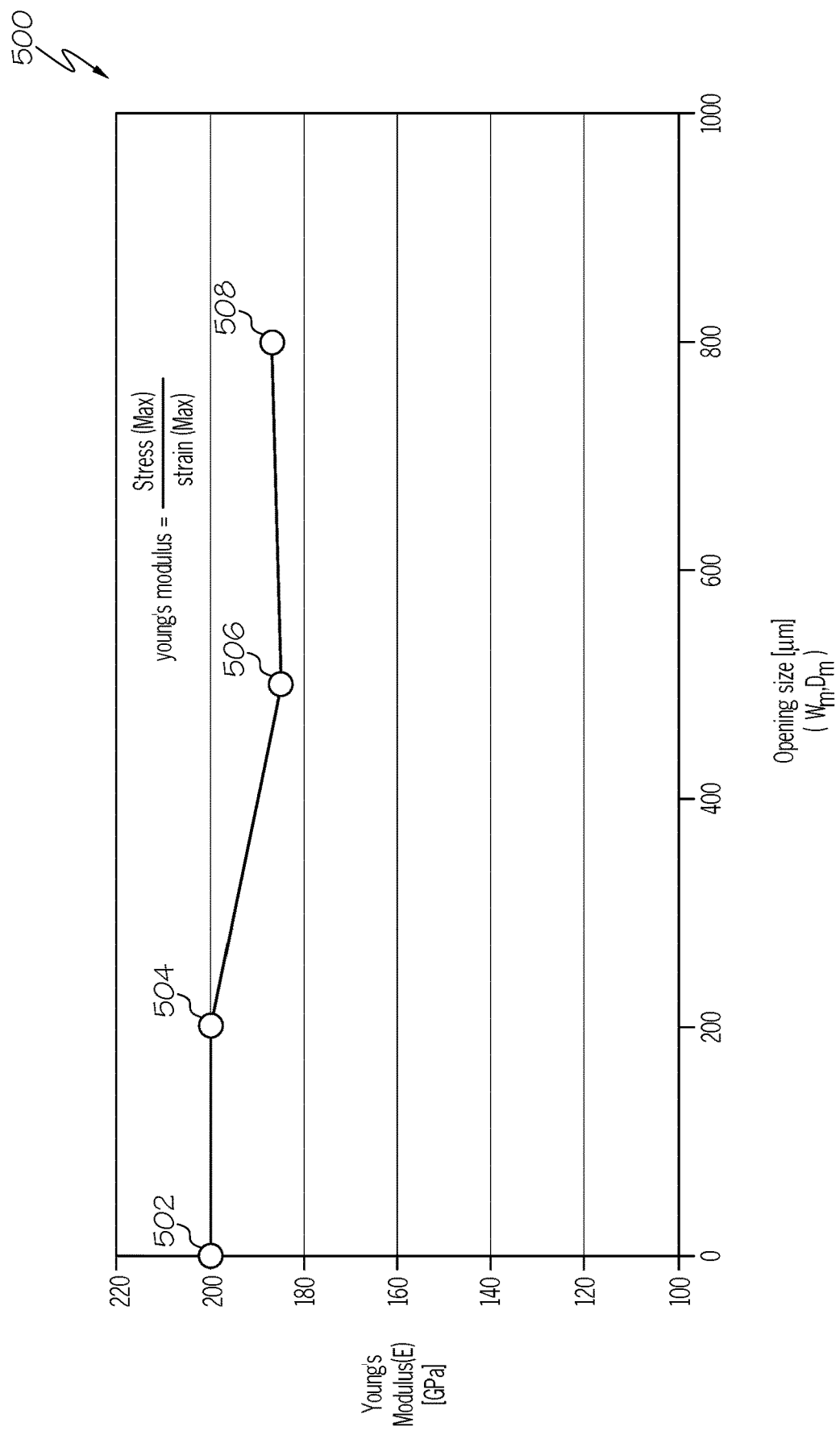
FIG. 5 depicts a graph of an illustrative relationship between the size of the openings in a mesh bond material to the Young's modulus of the mesh bond material, according to one or more embodiments shown and described herein.

Referring now to FIG. 5, a graph 500 of an illustrative relationship between the sizes of the openings (i.e., depicted along the x-axis) in a mesh bond material to the Young's modulus (i.e., depicted along the y-axis) of the mesh bond material is depicted. The graph 500 illustrates that as the size of the openings of the mesh bond material are increased, the Young's modulus of the mesh bond material can be decreased. In particular, the mesh bond material tested and for which the results are depicted in FIG. 5 includes a plurality of openings having a square shape of varying sizes. The size of the opening is defined by one dimension of the square opening. At data point 502, the Young's modulus of a bond layer that is a solid bond layer without any openings is depicted. At data point 504, the Young's modulus of a mesh bond material having square shaped openings with a width and depth dimensions of 200 μm is depicted to be about 200 GPa. At data point 506, the Young's modulus of a mesh bond material having square shaped openings with a width and depth dimensions of about 500 μm is depicted to be about 185 GPa. At data point 508, the Young's modulus of a mesh bond material having square shaped openings with a width and depth dimensions of about 800 μm is depicted to be about 190 GPa. In general, as the size of the opening increases, the Young's modulus decreases. However, as depicted at data point 508, the Young's modulus appears to plateau with respect to the previous opening size after a particular opening size has been reached. Such a plateau may occur when the tensile strength and the yield strength of a material converge.

Figure 6:
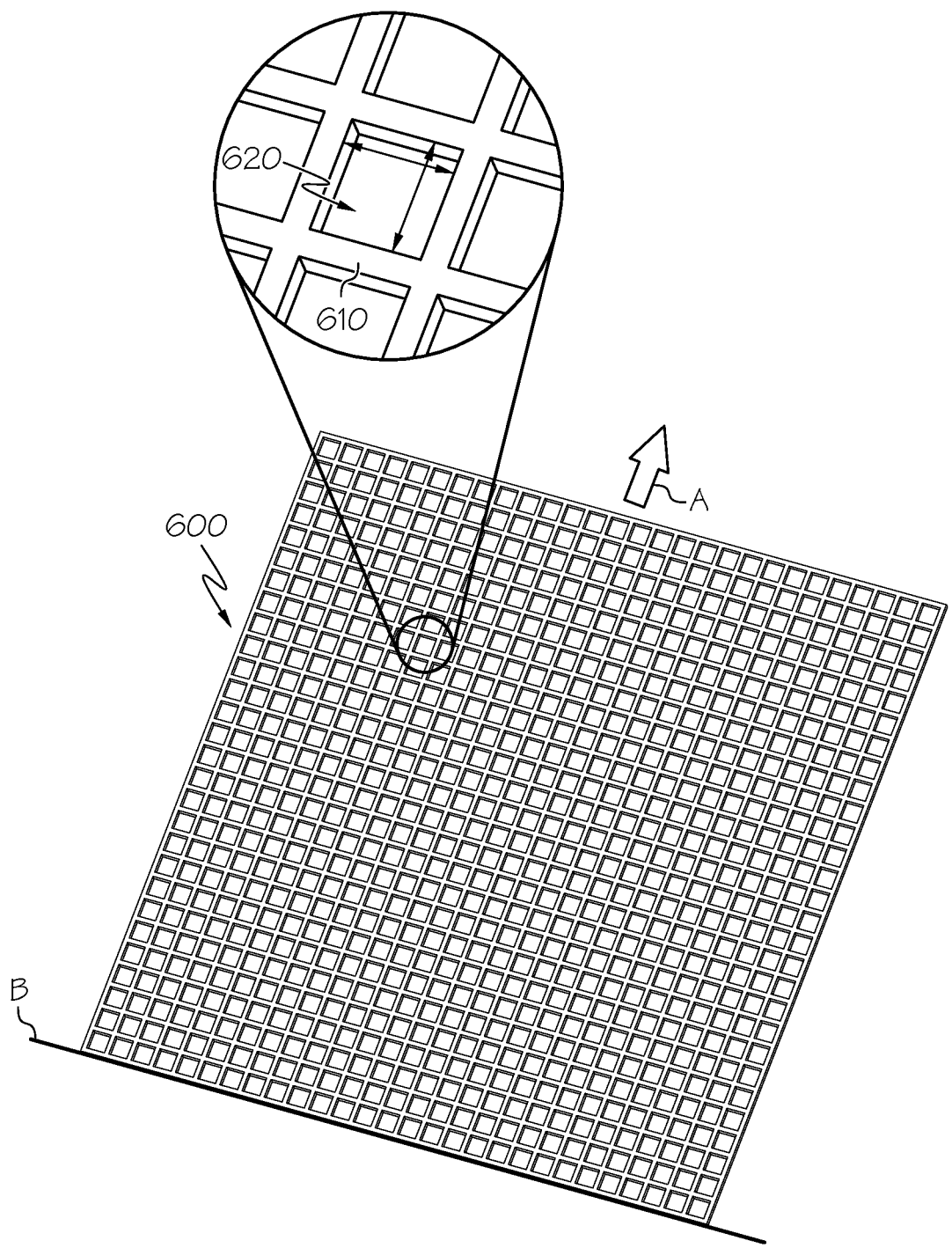
FIG. 6 depicts an illustration of a process for adjusting the Young's modulus of a mesh bond material, according to one or more embodiments shown and described herein.

Referring now to FIG. 6, an illustration of a process for determining the Young's modulus of a mesh bond material 600 having at least one layer 610 with openings 620 is depicted. The Young's modulus is the relationship between stress (either average or maximum value) and strain (either average or maximum value) of a material. To calculate the Young's modulus of a material 600, a sample of the material 600 may be fixed at one end and attached to a load on the other end. An example configuration is depicted in FIG. 6, where one end of a mesh bond material 600 is fixed along location B and an end opposite is pulled in the direction of arrow A at a predefined load amount. The amount of extension is determined by calculating how much the material 600 was stretched without irreversible deformation as compared a reference position determined by an unloaded material 600. The procedure may be repeated for one or more loading values to determine the Young's modulus for the material 600.

It should now be understood that a mesh bond material may be formed from a variety of materials, thicknesses, geometries and sizes. The following describes methods for forming the mesh bond material and electronic assemblies having a mesh bond material for reducing stress concentrations in the bond layer between a semiconductor device and a substrate.

Figure 7:
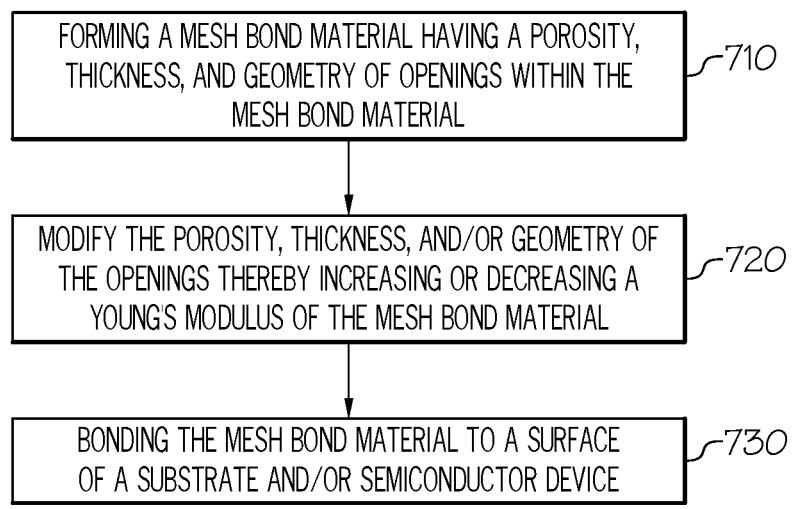
FIG. 7 depicts a flowchart of an illustrative method for forming and adjusting the Young's modulus of a mesh bond material, according to one or more embodiments shown and described herein.

Referring to FIG. 7, a flow chart of an illustrative method for forming a mesh bond material and adjusting the Young's modulus of a mesh bond material is depicted. In embodiments, a method of forming an electronic assembly with a mesh bond material may include forming a mesh bond material having a porosity (i.e., a plurality of openings) a thickness, and geometry of the openings within the mesh bond material, at block 710. For example, a mesh bond material may be formed having a first surface spaced apart from a second surface by a thickness of material and one or more openings extending from the first surface through the thickness of the mesh bond material to the second surface. In some embodiments, the mesh bond material includes a composite of at least two metals, where a first metal is encased (e.g., as a core) within a second metal and the first metal has a first Young's modulus less than a second Young's modulus of the second metal. In other embodiments, the mesh bond material comprises a composite of at least two metals, where a first metal is positioned between layers of a second metal and the first metal has a first Young's modulus less than a second Young's modulus of the second metal. The first metal may be Au, Cu, Ni, or any other metal or alloy and the second metal may be different from the first metal such as Au, Cu, Ni or any other metal or alloy. Additionally, the mesh bond material may be formed where the geometry of the one or more openings in the mesh bond material comprises at least one of a circle, a rectangle, a square, a hexagon, a triangle, or the like.

Once the mesh bond material is formed, the Young's modulus may be tuned by adjusting at least one of the thickness of the mesh bond material, a geometry of the one or more openings, or a size of the one or more openings of the mesh bond material, such a tuning may be accomplished through additive manufacturing, electrodeposition, molding, photolithography or similar processes, at block 720. The mesh bond material may be modified in a post fabrication process including, for example, laser cutting to reshape or increase the size of the openings, rolling the mesh to reduce the thickness of the material of a single layer before applying additional layers or adjusting the thickness of an entire composite mesh bond material. For example, the mesh bond material may be post processed to reduce the thickness of the material and in some embodiments, additional layers or coatings may be added such as Ni, Sn, or another metal or alloy to facilitate bonding with the surface of a semiconductor device. While a single layer mesh bond material is referred to hereinabove, the process of modifying the mesh bond material may also apply to a mesh bond material made of a composite of materials.

The mesh bond material may then be bonded to the surface of the semiconductor device, at block 730. In some embodiments, bonding the mesh bond material to the semiconductor device includes reflowing solder with the mesh bond material and the semiconductor device. The mesh bond material may also be bonded to the semiconductor device and/or substrate through one of a variety of techniques, such as solder reflow, wave soldering, laser soldering, ultrasonic bonding, thermosonic bonding, TLP bonding or the like. Additionally, the surface of the mesh bond material that is opposite the surface of the mesh bond material bonded to the semiconductor device or substrate may be bonded to a semiconductor device or substrate. That is, the mesh bond material may form an electronic assembly bonding two semiconductor devices, a semiconductor device to a substrate or a similar material such as an electrode, wire, or the like.

Figure 8:
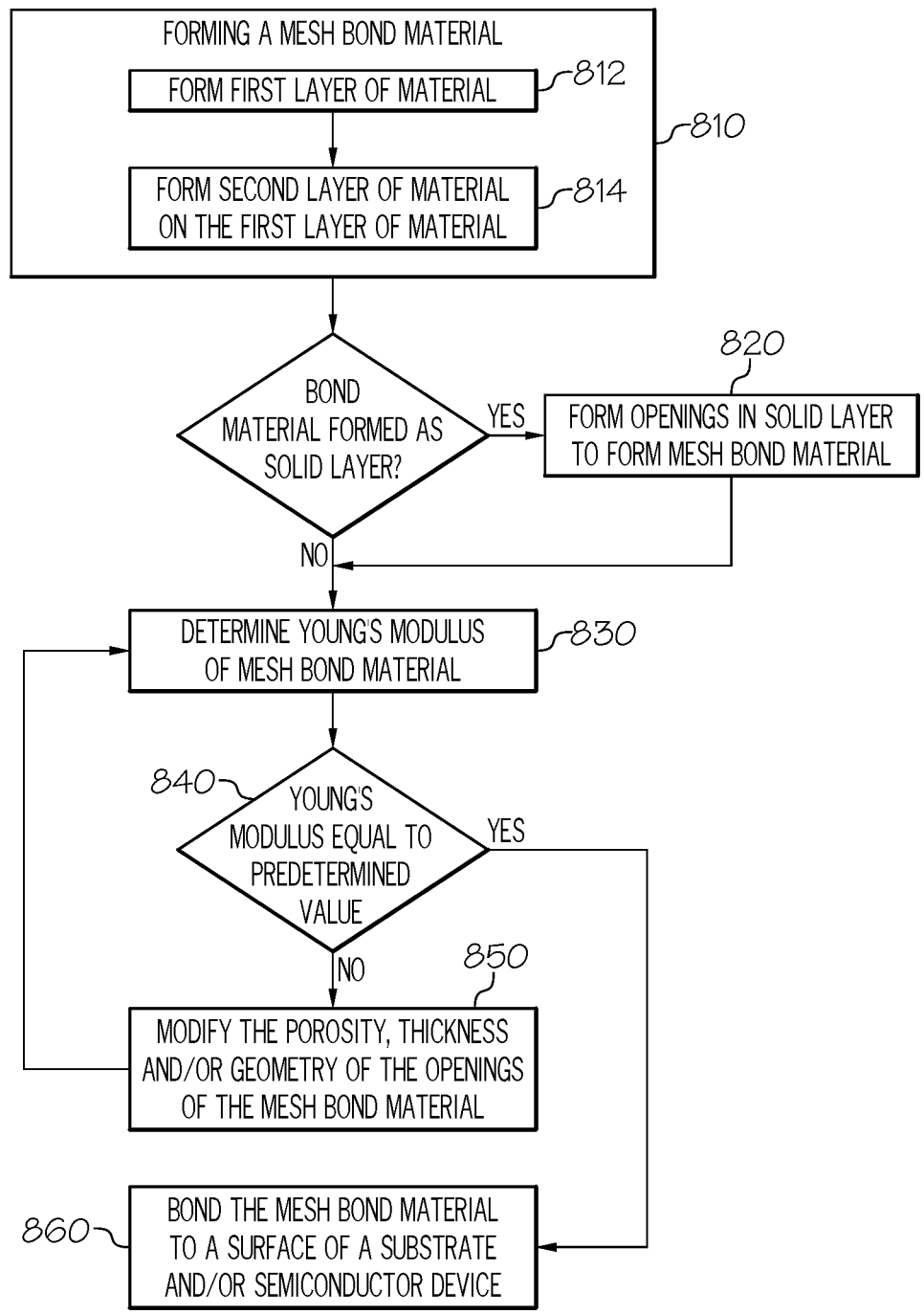
FIG. 8 depicts another flowchart of an illustrative method for forming and adjusting the Young's modulus of a mesh bond material, according to one or more embodiments shown and described herein.

Referring to FIG. 8, another flow chart of an illustrative method for forming and adjusting the Young's modulus of a mesh bond material is depicted. In embodiments, a method of forming an electronic assembly with a mesh bond material may include forming a mesh bond material having a porosity (i.e., a plurality of openings), a thickness, and geometry of the openings within the mesh bond material, at block 810. For example, forming the mesh bond material may include forming a composite material having at least two metals. A first layer of metal may be disposed on a support medium (e.g., a semiconductor, substrate, or other supporting material such as a powder bed used in additive manufacturing or laser sintering applications), at block 812. Disposing the first layer may be accomplished through any known or yet to be discovered formation process, such as electrodeposition (e.g., electroplating), molding, physical vapor deposition, chemical deposition, laser metal deposition, additive manufacturing processes, or any other deposition process. The first layer may be a first metal comprising Au, Cu, Ni, or any other metal or alloy. A second layer of the mesh bond material may be disposed on the first layer thereby forming a second layer of the mesh bond material, at block 814. The second layer may be disposed using any known or yet to be discovered formation process such as electrodeposition (e.g., electroplating), molding, physical vapor deposition, chemical deposition, laser metal deposition, additive manufacturing processes, or any other deposition process. The second layer may be a second metal (e.g., in some embodiments different from the first layer) including Au, Cu, Ni, or any other metal or alloy. While only two layers are described herein with respect to this method, it should be understood that these steps may be repeated any number of times to form two or more layers (or cores) of a composite of a mesh bond material.

For example, a coating layer of a material to facilitate bonding of the mesh bond material to a semiconductor device, substrate, electrode, wire, or the like may be formed as a third layer. In some embodiments, the material of the first layer may be formed as a third layer to form a sandwich or encased structured with the second layer as a middle layer or core and a coating layer may then be applied over the surfaces of the first layer and the third layer to facilitate bonding of the mesh bond material with a semiconductor device, substrate, electrode, wire, or the like. However, in some embodiments, the coating layer may be applied after forming and adjusting the mesh bond material to have a Young's modulus value equal to a predetermined value, for example, after block 840, and before the step of bonding the mesh bond material to a surface of a substrate and/or semiconductor device, at block 860.

In some embodiments, the first layer and second layer may be formed by depositing material directly in the formation of a mesh structure having openings or may be formed as a solid layer. In the instance where the composite material is formed as a solid layer, a post process of forming openings within the solid composite material may be completed, at block 820. For example, a plurality of openings may be formed through a laser cutting, etching or machining process. The openings may be have any geometry (i.e., size and/or shape) to alter the Young's modulus of the solid layer and form a mesh bond layer therefrom. In some embodiments, the plurality of openings may be symmetrically spaced across the volume of the mesh bond material. In other embodiments, openings may be formed close together or far apart in a symmetrical or asymmetrical pattern depending on the thermal profile of a semiconductor device in order to relieve local concentrations of stress because of temperature, electrical, or mechanical effects.

Once a mesh bond material having openings is formed, one or more samples may be tested to determine the Young's modulus of the mesh bond material, at block 830. A process as described with reference to FIG. 6 may be used to determine the Young's modulus of a mesh bond material. Still referring to FIG. 8, the tested value of the Young's modulus of the mesh bond material is then compared to a predetermined value of the Young's modulus that is specified for a particular electronic assembly, at block 840. If the tested value of the Young's modulus is equal to or within an acceptable range (e.g., +/−1%, 2%, 5%, 10%, or 15% of the predetermined Young's modulus) for use in the electronic assembly, as determined at block 840, then the mesh bond material may be bonded to a surface of a substrate and/or a semiconductor device, at block 860. The process of bonding the mesh bond material to a substrate and/or semiconductor may be repeated such that an electronic assembly is formed with the mesh bond material forming a mesh bond layer.

In some embodiments, the process of bonding the mesh bond material to the semiconductor device may include reflowing solder with the mesh bond material and the semiconductor device. The mesh bond material may also be bonded to the semiconductor device and/or substrate through one of a variety of techniques, such as solder reflow, wave soldering, laser soldering, ultrasonic bonding, thermosonic bonding, TLP bonding or the like. Additionally, the surface of the mesh bond material that is opposite the surface of the mesh bond material bonded to the semiconductor device or substrate may be bonded to a semiconductor device or substrate. That is, the mesh bond material may form an electronic assembly bonding two semiconductor devices or a semiconductor device to a substrate or a similar material such as an electrode, wire, or the like together.

However, when the tested Young's modulus is not equal to or does not fall with an acceptable tolerance range for use as a mesh bond layer in an electronic assembly, as determined at block 840, then the mesh bond material may be modified to increase or decrease the Young's modulus of the mesh bond material, at block 850. For example, modifying the Young's modulus of the mesh bond material such that the Young's modulus of the mesh bond material is increased or decreased may include modifying at least one of the thickness of the mesh bond material, a thickness or one or more layers of the composite of the mesh bond material, a geometry of the one or more openings, or a size of the one or more openings. That is, by decreasing the thickness of the mesh bond material the Young's modulus of the mesh bond material may be decreased. In addition to or independently from adjusting the thickness, the size of the openings of the mesh bond material may be increased thereby decreasing the Young's modulus of the mesh bond material. Once the mesh bond material is modified at block 850, the Young's modulus of the mesh bond material may be retested at block 830.

Figure 9:
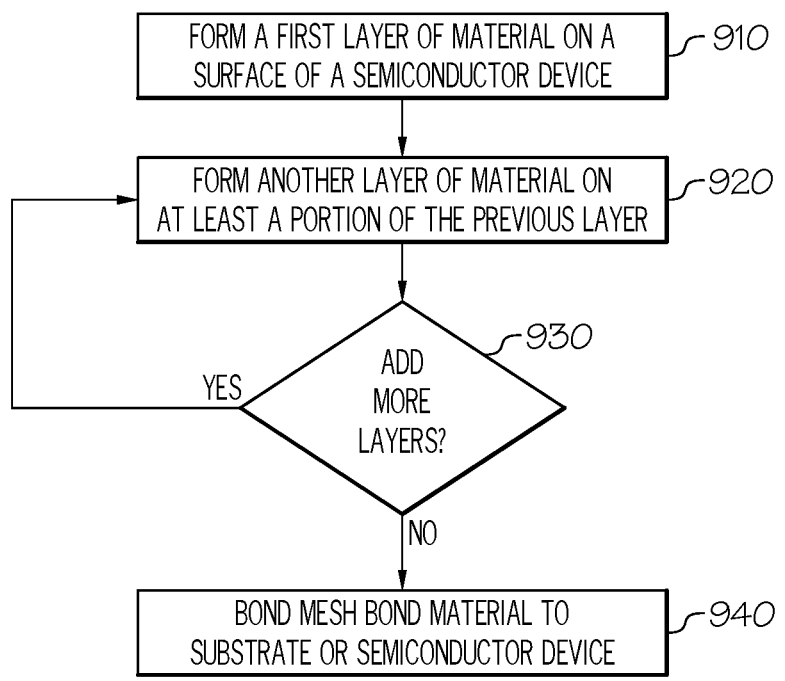
FIG. 9 depicts a flow chart of an illustrative method for forming a mesh bond material exhibiting a predetermined Young's modulus and forming an electronic assembly with the mesh bond material, according to one or more embodiments shown and described herein.

Referring to FIG. 9, a flow chart of an illustrative method for forming a mesh bond material exhibiting a predetermined Young's modulus and forming an electronic assembly with the mesh bond material is depicted. In some embodiments, forming the mesh bond material may be carried out directly on the surface of a semiconductor device. For example, the mesh bond material may be formed by disposing a first layer of material having a first metal and a first Young's modulus to the surface of the semiconductor device such that the first metal forms a mesh pattern defined by a first thickness that is a portion of the thickness of the mesh bond material and the plurality of openings, at block 910. In some embodiments, the first layer may include a layer of tin (Sn), lead (Pb), and/or antimony (Sb), a combination thereof or another metal or metal alloy for bonding to the semiconductor device and substrate of an electronic assembly. The mesh bond material may be formed using processes such as electrodeposition (e.g., electroplating), physical vapor deposition, chemical deposition, laser metal deposition, additive manufacturing processes, or any other known or yet to be developed depositions process. Once formed, the mesh bond material may be adjusted or further tuned to achieve a predefined Young's modulus by adding or removing material from the mesh bond material.

In some embodiments where the mesh bond material is formed directly on the surface of a semiconductor device, a variety of processes may be implemented to apply the one or more layers of the mesh bond material. For example, one or more layers of the mesh bond material may be formed using an additive manufacturing process, selective laser melting or direct metal laser sintering process or the like. Before applying materials or layers of the mesh bond material on the semiconductor device, the surface of the semiconductor device may be cleaned, prepared, and/or masked. For example, a mask layer (e.g., a photomasking layer) may be applied to portions of the surface of the semiconductor device to prevent the formation of the mesh bond material in the portions having the mask layer. Once the mesh bond material is formed, the mask layer may be removed through a chemical or mechanical process.

Using the same or a different formation process, a second layer having a second metal may then be applied over at least a portion of the first layer of material having a second thickness that is a portion of the thickness of the mesh bond material, at block 920. For example, the second layer may completely cover the first layer or may cover only a portion of the first layer, for example, when forming a wire-type mesh bond material having a core material. In some embodiments, the second metal has a second Young's modulus and the second Young's modulus of the second metal is less than the first Young's modulus of the first metal. Additionally, the second thickness of the second metal may be increased or decreased to obtain a predetermined Young's modulus of mesh bond material. If more layers are to be added as determined at block 930, then a third layer and/or more layers may be disposed on the first layer and second layers. An outermost layer of the mesh bond material may again be a layer of tin (Sn), lead-free solder, and/or antimony (Sb), a combination thereof or another metal or metal alloy to facilitate bonding to the semiconductor device and substrate of an electronic assembly. The layer of tin (Sn), lead-free solder, and/or antimony (Sb), a combination thereof or another metal or metal alloy to facilitate bonding may be a layer integrally formed with the mesh bond material or may be a coating applied to the formed mesh bond material. For example, the coating layer may be applied in the form or a paste (e.g., a solder paste) or through a process such as electrodeposition (e.g., electroplating), molding, physical vapor deposition, chemical deposition, laser metal deposition, additive manufacturing processes, or any other known or yet to be developed deposition process. The mesh bond material may then be bonded to a substrate or a semiconductor device, at block 940, thereby forming an electronic assembly.

In some embodiments, a third layer of material may be applied to the mesh bond material formed by the first layer and the second layer. The third layer of material may have a Young's modulus that is greater than the second Young's modulus of the second metal. The third layer may include the same metal as the first layer (i.e., the first metal) and the first layer and the third layer have the same Young's modulus. In some embodiments, the mesh bond material may have a composite structure having layers of Sn—Ni—Cu/Au—Ni—Sn or other combinations of metals and alloys.

Once the mesh bond material is formed on the semiconductor device or substrate, the mesh bond material may then be bonded to the surface of a substrate or a semiconductor device, at block 940. In some embodiments, bonding the mesh bond material to the semiconductor device includes reflowing solder with the mesh bond material and the semiconductor device. The mesh bond material may also be bonded to the semiconductor device and/or substrate through one of a variety of techniques, such as solder reflow, wave soldering, laser soldering, ultrasonic bonding, thermosonic bonding, TLP bonding or the like. That is, the mesh bond material may form an electronic assembly bonding two semiconductor devices, a semiconductor device to a substrate or a similar material such as an electrode, wire, or the like.

It should now be understood that a mesh bond material may be formed and utilized in the assembly of an electronic assembly to reduce stress concentration within the bond layer provided by the mesh bond material. That is, by modifying parameters such as the thickness of the mesh bond material or one or more of the layers of the composite of the mesh bond material, the geometry and/or the size of the openings of the mesh bond material or the materials thereof may tune the Young's modulus of the mesh bond material such that stress concentrations are reduced. The modifications may be implemented during formation of the mesh bond material and/or in a post fabrication process including, for example, laser cutting to reshape or increase the size of the openings, rolling the mesh to reduce the thickness of the material of a single layer before applying additional layers. For example, a mesh bond material comprising a single layer and a single material, for example, Cu may be formed. The mesh bond material may then be post processed to reduce the thickness of the material and then additional layers may be added such as Ni to facilitate bonding with the surface of a semiconductor device.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of forming an electronic assembly with a mesh bond layer, the method comprising:
    forming a mesh bond material comprising a first surface spaced apart from a second surface by a thickness of the mesh bond material and one or more openings extending from the first surface through the thickness of the mesh bond material to the second surface;
    adjusting at least one of: a geometry of the one or more openings and a size of the one or more openings of the mesh bond material, wherein the adjusting modifies a yield point of a Young's modulus of the mesh bond material such that the mesh bond material operates in an elastic region when assembled in the electronics assembly; and
    bonding the first surface of the mesh bond material to a surface of a semiconductor device.

2. The method of claim 1, further comprising bonding the second surface of the mesh bond material to a surface of a substrate.

3. The method of claim 1, further comprising coating the mesh bond material with a layer of Sn to facilitate bonding with the semiconductor device.

4. The method of claim 1, wherein adjusting comprises increasing the size of the one or more openings of the mesh bond material to decrease the Young's modulus of the mesh bond material.

5. The method of claim 1, wherein the mesh bond material comprises a first metal encased as a core within a second metal, the first metal exhibiting a first Young's modulus, and the second metal exhibiting a second Young's modulus, wherein the first Young's modulus is less than the second Young's modulus.

6. The method of claim 1, wherein the mesh bond material comprises a first metal positioned between layers of a second metal, the first metal exhibiting a first Young's modulus, the second metal exhibiting a second Young's modulus, and wherein the first Young's modulus is less than the second Young's modulus.

7. A method of forming an electronic assembly having a mesh bond layer, the method comprising:
    forming a composite mesh bond material comprising a first metal adjacent a second metal, the composite mesh bond material comprising a first surface spaced apart from a second surface by a thickness of the composite mesh bond material and one or more openings extending from the first surface through the thickness of the composite mesh bond material to the second surface;
    modifying the composite mesh bond material such that the composite mesh bond material exhibiting a first composite Young's modulus is adjusted to a second composite Young's modulus, wherein the first composite Young's modulus is different than the second composite Young's modulus and modifying the composite mesh bond material includes adjusting at least one of: a geometry of the one or more openings and a size of the one or more openings of the composite mesh bond material, wherein adjusting modifies a yield point of a Young's modulus of the mesh bond material such that the mesh bond material operates in an elastic region when assembled in the electronics assembly; and
    bonding the first surface of the composite mesh bond material to a surface of a semiconductor device.

8. The method of claim 7, further comprising bonding the second surface of the composite mesh bond material to a substrate.

9. The method of claim 7, wherein modifying comprises increasing the size of the one or more openings of the composite mesh bond material to decrease the first composite Young's modulus of the composite mesh bond material.

10. The method of claim 7, wherein the composite mesh bond material comprises the first metal encased as a core within the second metal, the first metal exhibiting a first Young's modulus, the second metal exhibiting a second Young's modulus, and the first Young's modulus is less than the second Young's modulus.

11. The method of claim 7, wherein the composite mesh bond material comprises the first metal positioned between layers of the second metal, the first metal exhibiting a first Young's modulus, the second metal exhibiting a second Young's modulus, and the first Young's modulus is less than the second Young's modulus.

12. The method of claim 7, wherein forming the composite mesh bond material includes electrodeposition of at least one metal of the composite mesh bond material.

13. An electronic assembly comprising:
a semiconductor device; and
a mesh bond layer bonded to the semiconductor device, wherein:
the mesh bond layer includes a mesh bond material having:
a first surface spaced apart by a thickness of material from a second surface opposite the first surface, and
one or more openings extending from the first surface through the thickness of material to the second surface, wherein at least one of a geometry of the one or more openings and a size of the one or more openings is adjusted to a yield point of a Young's modulus of the mesh bond layer such that the mesh bond layer operates in an elastic region when the electronic assembly is subjected to a predefined range of temperatures.

14. The electronic assembly of claim 13, further comprising a substrate bonded to the second surface of the mesh bond layer.

15. The electronic assembly of claim 13, wherein the predefined range of temperatures is about minus 50 degrees C. to about 300 degrees C.

16. The electronic assembly of claim 13, wherein the mesh bond material further comprises a composite of materials, the composite of materials includes one or more layers of at least one of Cu, Au, and Ni.

17. The electronic assembly of claim 16, wherein the composite of materials includes a layer of Cu or Au positioned between layers of Ni.

18. The electronic assembly of claim 16, wherein the composite of materials includes a first material positioned as a core and a second material positioned as a cladding that encases the first material, and the first material exhibits a first Young's modulus, and the second material exhibits a second Young's modulus, wherein the first Young's modulus is less than the second Young's modulus.

* * * * *